United States Patent
Cho et al.

(10) Patent No.: US 9,051,178 B2
(45) Date of Patent: Jun. 9, 2015

(54) TRANSMISSIVE IMAGE MODULATOR INCLUDING STACKED DIODE STRUCTURE HAVING MULTI ABSORPTION MODES

(75) Inventors: Yong-chul Cho, Suwon-si (KR); Yong-tak Lee, Gwangju (KR); Jang-woo You, Yongin-si (KR); Byung-hoon Na, Seoul (KR); Yong-hwa Park, Yongin-si (KR); Chang-young Park, Yongin-si (KR); Hee-ju Chio, Jeonju-si (KR); Gun-wu Ju, Daegu (KR)

(73) Assignees: GWANGJU INSTITUTE OF SCIENCE AND TECHNOLOGY, Gwangju (KR); SAMSUNG ELECTRONICS CO., LTD., Suwon-si (KR)

( * ) Notice: Subject to any disclaimer, the term of this patent is extended or adjusted under 35 U.S.C. 154(b) by 92 days.

(21) Appl. No.: 13/617,920

(22) Filed: Sep. 14, 2012

(65) Prior Publication Data
US 2013/0175500 A1    Jul. 11, 2013

(30) Foreign Application Priority Data
Jan. 5, 2012    (KR) .................... 10-2012-0001550

(51) Int. Cl.
G02F 1/017 (2006.01)
B82Y 20/00 (2011.01)
H01L 31/0352 (2006.01)

(52) U.S. Cl.
CPC ......... *B82Y 20/00* (2013.01); *H01L 31/035236* (2013.01); *G02F 2203/12* (2013.01); *G02F 1/017* (2013.01)

(58) Field of Classification Search
CPC .................. B82Y 20/00; H01S 5/0265; G02F 1/015–1/025; G02F 2203/12

USPC ............... 257/9–39, 184–189, 414, 428–466; 359/237–324; 398/138, 169
See application file for complete search history.

(56) References Cited

U.S. PATENT DOCUMENTS

| | | | |
|---|---|---|---|
| 4,525,687 A | | 6/1985 | Chemla et al. |
| 4,818,079 A | * | 4/1989 | Maserjian .................... 359/299 |

(Continued)

FOREIGN PATENT DOCUMENTS

| | | |
|---|---|---|
| JP | 2006-93350 A | 4/2006 |
| JP | 2007-219561 A | 8/2007 |
| JP | 2007-227860 A | 9/2007 |

OTHER PUBLICATIONS

Lin el al., "Normally on GaAs/AlAs multiple-quantum well Fabry-Perot transmission modulator with ON/OFF contrast ratios >7.4", Applied Physics Letters, vol. 66, No. 10, Mar. 6, 1995, 3 pages total, http://scitation.aip.org/content/aip/journal/apl.

(Continued)

*Primary Examiner* — Steven J Fulk
*Assistant Examiner* — Eric Ward
(74) *Attorney, Agent, or Firm* — Sughrue Mion, PLLC

(57) ABSTRACT

A transmissive light modulator including a first reflection layer; a first active layer, arranged on the first reflection layer and including a plurality of quantum well layers and a plurality of barrier layers; a second reflection layer arranged on the first active layer; a second active layer, arranged on the second reflection layer and including a plurality of quantum well layers and a plurality of barrier layers; and a third reflection layer arranged on the second active layer, wherein the first reflection layer and the third reflection layer are each doped with a first type dopant, and the second reflection layer is doped with a second type dopant, which is electrically opposite to the first type dopant.

25 Claims, 20 Drawing Sheets

(56) References Cited

U.S. PATENT DOCUMENTS

| | | | |
|---|---|---|---|
| 5,023,944 A * | 6/1991 | Bradley | 359/107 |
| 5,311,278 A * | 5/1994 | Rosencher | 356/326 |
| 5,315,430 A * | 5/1994 | Brennan et al. | 359/248 |
| 5,345,328 A * | 9/1994 | Fritz et al. | 359/248 |
| 5,426,512 A | 6/1995 | Watson | |
| 6,154,299 A | 11/2000 | Gilbreath et al. | |
| 6,331,911 B1 | 12/2001 | Manassen et al. | |
| 6,483,094 B1 | 11/2002 | Yahav et al. | |
| 7,067,853 B1 | 6/2006 | Yao | |
| 7,508,858 B2 * | 3/2009 | Oktyabrsky et al. | 372/92 |
| 7,719,746 B2 * | 5/2010 | Goetz et al. | 359/245 |
| 2010/0328750 A1 * | 12/2010 | Kim et al. | 359/245 |
| 2011/0181936 A1 * | 7/2011 | Cho et al. | 359/260 |
| 2014/0191196 A1 * | 7/2014 | Cho et al. | 257/21 |

OTHER PUBLICATIONS

Herman van de Stadt & Johan M. Muller, "Multimirror Fabry-Perot interferometeres", Optical Society of America, vol. 2, No. 8, Aug. 1985, p. 1363-1370.

M.K. Chin, "Design Considerations for a Multiple-Quantum-Well Nonresonant Surface-Normal Modulator", IEEE Photonics Technology Letters, vol. 4, No. 12, Dec. 1992, p. 1357-1360.

Goossen et al., "Optical Bandwidth Considerations in p-i-n Multiple Quantum-Well Modulator", Journal of Lightwave Technology, vol. 13, No. 3, Mar. 1995, p. 461-464.

Junique et al., "Multiple Quantum Well Spatial light Modulators Design—Fabrication—Characterization", Technology and Applications, Uzi Efron, Proceedings of SPIE, vol. 4457, 2001, p. 62-71.

K. W. Goossen et al., "Interleaved-Contact Electroabsorption Modulator Using Doping-Selective Electrodes with 25°C to 95°C Operation Range", IEEE Photonics Technology Letters, vol. 5, No. 2, Feb. 1993, p. 181-183.

K. W. Goossen et al., "Stacked-Diode Electroabsorption Modulator", IEEE Photonics Technology Letters, vol. 6, No. 8, Aug. 1994, p. 936-938.

Daxin Liu, "Fabry-Perot Modulator and Vertically Integrated Coupled Cavity Light Emitting Diode", Submitted to the department of Applied Physics and the committee on graduate studies of Stanford University, Dec. 1997, 105 pages total.

H. G. Heinol et al., "Electro-Optical Correlation Arrangement for Fast 3D Cameras: Properties and Facilities of the Electro-Optical Mixer Device", SPIE, 1997, vol. 3100, p. 254-260.

M. G. Xu et al., "Wide optical bandwidth asymmetric Fabry-Perot reflection modulator using the quantum confined Stark effect", Journal of Applied Physics, vol. 84, No. 10, Nov. 15, 1998, p. 5761-5765.

S. V. Gryshchenko, "Theoretical study of the quantum efficiency of InGaAs/GaAs resonant cavity enhanced photodetectors", IEEE, 2007, pp. 20-22, OPT, 2007, Jun. 20-22, 2007, Kharkiv, Ukraine.

K. W. Goossen et al., "Electroabsorption in ultranarrow-barrier GaAs/AlGaAs multiple quantum well modulators", Applied Physics Letters, vol. 64, No. 9, Feb. 28, 1994, p. 1071-1073.

L. Buydens et al., "GaAs/AlGaAs multiple-quantum-well vertical optical modulators on glass using the epitaxial lift-off technique", Optics Letters, vol. 16, No. 12, Jun. 15, 1991, p. 916-918.

Eli Yablonovitch et al., "Extreme selectivity in the lift-off of epitaxial GaAs films", Applied Physics Letters, vol. 51, No. 26, Dec. 28, 1987, p. 2222-2224.

C. Lethien et al., "850nm Transmission Type ElectroAbsorption Modulator on SiO2 substrate", Abs. 227, 205th Meeting, The Electrochemical Society, Inc., 2004, 1 page total.

\* cited by examiner

FIG. 10

| | Material | Thickness [Å] | Remarks |
|---|---|---|---|
| 160 | GaAs | 100 | N contact |
| 150 { 150a | n-Al$_{0.2}$Ga$_{0.8}$As | 610 | Top DBR (R1 pair) |
| 150b | n-Al$_{0.87}$Ga$_{0.13}$As | 685 | |
| 141 | Al$_{0.31}$Ga$_{0.69}$As | Y" | Cladding |
| 142 | GaAs | X1 | Active (Y' well) (Y-λ) |
| 140 { 143 | Al$_{0.31}$Ga$_{0.69}$As | 40 | |
| 144 | GaAs | X2 | |
| 121 | Al$_{0.31}$Ga$_{0.69}$As | Y" | Cladding |
| 130 { 130b | p-Al$_{0.87}$Ga$_{0.13}$As | 685 | Middle DBR (R2 pair) |
| 130a | p-Al$_{0.2}$Ga$_{0.8}$As | 610 | |
| 132 | p-Al$_{0.87}$Ga$_{0.13}$As | 685 | Phase matching |
| 121 | Al$_{0.31}$Ga$_{0.69}$As | Y" | Cladding |
| 122 | GaAs | X1 | Active (Y' well) (Y-λ) |
| 120 { 123 | Al$_{0.31}$Ga$_{0.69}$As | 40 | |
| 124 | GaAs | X2 | |
| 121 | Al$_{0.31}$Ga$_{0.69}$As | Y" | Cladding |
| 110 { 110b | n-Al$_{0.87}$Ga$_{0.13}$As | 685 | Bottom DBR (R3 pair) |
| 110a | n-Al$_{0.2}$Ga$_{0.8}$As | 610 | |
| 102 | GaAs | 100 | N contact |
| 101 | | | GaAs Sub. |

FIG. 11

⇩ Air (n_a = 1.0)

| | | Material | Thickness [Å] | Remarks |
|---|---|---|---|---|
| 150 | 150a | n-Al$_{0.2}$Ga$_{0.8}$As | 610 | Top DBR (2 pair) |
| | 150b | n-Al$_{0.87}$Ga$_{0.13}$As | 685 | |
| 140 | 141 | Al$_{0.31}$Ga$_{0.69}$As | 36 | Cladding |
| | 142 | GaAs | 85 | Active (8 nm-28 well) (8.5 nm-29 well) (3-λ) |
| | 143 | Al$_{0.31}$Ga$_{0.69}$As | 40 | |
| | 144 | GaAs | 80 | |
| | 121 | Al$_{0.31}$Ga$_{0.69}$As | 36 | Cladding |
| 130 | 130b | p-Al$_{0.87}$Ga$_{0.13}$As | 685 | Middle DBR (11 pair) |
| | 130a | p-Al$_{0.2}$Ga$_{0.8}$As | 610 | |
| | 132 | p-Al$_{0.87}$Ga$_{0.13}$As | 685 | Phase matching |
| 120 | 121 | Al$_{0.31}$Ga$_{0.69}$As | 36 | Cladding |
| | 122 | GaAs | 85 | Active (8 nm-28 well) (8.5 nm-29 well) (3-λ) |
| | 123 | Al$_{0.31}$Ga$_{0.69}$As | 40 | |
| | 124 | GaAs | 80 | |
| | 121 | Al$_{0.31}$Ga$_{0.69}$As | 36 | Cladding |
| 110 | 110b | n-Al$_{0.87}$Ga$_{0.13}$As | 685 | Bottom DBR (2 pair) |
| | 110a | n-Al$_{0.2}$Ga$_{0.8}$As | 610 | |

⇩ Air (n_a = 1.0)

FIG. 13

⇩ Air ($n_a = 1.0$)

| | | Material | Thickness [Å] | Remarks |
|---|---|---|---|---|
| 150 | 150a | n-$Al_{0.2}Ga_{0.8}As$ | 610 | Top DBR (2 pair) |
| | 150b | n-$Al_{0.87}Ga_{0.13}As$ | 685 | |
| 140 | 141 | $Al_{0.31}Ga_{0.69}As$ | 56 | Cladding |
| | 142 | GaAs | 70 | Active (7 nm-30 well) (7.5 nm-32 well) (3-λ) |
| | 143 | $Al_{0.31}Ga_{0.69}As$ | 40 | |
| | 144 | GaAs | 75 | |
| | 121 | $Al_{0.31}Ga_{0.69}As$ | 56 | Cladding |
| 130 | 130b | p-$Al_{0.87}Ga_{0.13}As$ | 685 | Middle DBR (11 pair) |
| | 130a | p-$Al_{0.2}Ga_{0.8}As$ | 610 | |
| | 132 | p-$Al_{0.87}Ga_{0.13}As$ | 685 | Phase matching |
| 120 | 121 | $Al_{0.31}Ga_{0.69}As$ | 56 | Cladding |
| | 122 | GaAs | 70 | Active (7 nm-30 well) (7.5 nm-32 well) (3-λ) |
| | 123 | $Al_{0.31}Ga_{0.69}As$ | 40 | |
| | 124 | GaAs | 75 | |
| | 121 | $Al_{0.31}Ga_{0.69}As$ | 56 | Cladding |
| 110 | 110b | n-$Al_{0.87}Ga_{0.13}As$ | 685 | Bottom DBR (2 pair) |
| | 110a | n-$Al_{0.2}Ga_{0.8}As$ | 610 | |

⇩ Air ($n_a = 1.0$)

FIG. 15

| | Material | Thickness [Å] | Remarks |
|---|---|---|---|
| 160 | GaAs | 100 | P contact |
| 150a | p-Al$_{0.2}$Ga$_{0.8}$As | 610 | Top DBR (R1 pair) |
| 150b | p-Al$_{0.87}$Ga$_{0.13}$As | 685 | |
| 141 | Al$_{0.31}$Ga$_{0.69}$As | Y" | Cladding |
| 142 | GaAs | X1 | Active (Y' well) (Y-λ) |
| 143 | Al$_{0.31}$Ga$_{0.69}$As | 40 | |
| 144 | GaAs | X2 | |
| 121 | Al$_{0.31}$Ga$_{0.69}$As | Y" | Cladding |
| 130b | n-Al$_{0.87}$Ga$_{0.13}$As | 685 | Middle DBR (R2 pair) |
| 130a | n-Al$_{0.2}$Ga$_{0.8}$As | 610 | |
| 132 | n-Al$_{0.87}$Ga$_{0.13}$As | 685 | Phase matching |
| 121 | Al$_{0.31}$Ga$_{0.69}$As | Y" | Cladding |
| 122 | GaAs | X1 | Active (Y' well) (Y-λ) |
| 123 | Al$_{0.31}$Ga$_{0.69}$As | 40 | |
| 124 | GaAs | X2 | |
| 121 | Al$_{0.31}$Ga$_{0.69}$As | Y" | Cladding |
| 110b | p-Al$_{0.87}$Ga$_{0.13}$As | 685 | Bottom DBR (R3 pair) |
| 110a | p-Al$_{0.2}$Ga$_{0.8}$As | 610 | |
| 102 | GaAs | 100 | P contact |
| 101 | | | GaAs Sub. |

| | Material | Thickness [Å] | Structure |
|---|---|---|---|
| 160 | GaAs | 100 | N contact |
| 150a | Al$_{0.2}$Ga$_{0.8}$As | 610 | n-DBR / 2-pair |
| 150b | Al$_{0.87}$Ga$_{0.13}$As | 685 | |
| 151 | Al$_{0.2}$Ga$_{0.8}$As | 1220 | Micro-cavity (λ/2) |
| 150b | Al$_{0.87}$Ga$_{0.13}$As | 685 | n-DBR / 13.5-pair |
| 150a | Al$_{0.2}$Ga$_{0.8}$As | 610 | |
| 150b | Al$_{0.87}$Ga$_{0.13}$As | 685 | |
| 141 | Al$_{0.31}$Ga$_{0.69}$As | 62.6 | (3.5λ MQW) 7.5nm – 30well 8nm – 39well |
| 142 | GaAs | 75 | |
| 143 | Al$_{0.31}$Ga$_{0.69}$As | 40 | |
| 144 | GaAs | 80 | |
| 141 | Al$_{0.31}$Ga$_{0.69}$As | 62.6 | |
| 130b | Al$_{0.87}$Ga$_{0.13}$As | 685 | p-DBR / 13.5-pair |
| 130a | Al$_{0.2}$Ga$_{0.8}$As | 610 | |
| 121 | Al$_{0.31}$Ga$_{0.69}$As | 62.6 | (3.5λ MQW) 7.5nm – 30well 8nm – 39well |
| 122 | GaAs | 75 | |
| 123 | Al$_{0.31}$Ga$_{0.69}$As | 40 | |
| 124 | GaAs | 80 | |
| 121 | Al$_{0.31}$Ga$_{0.69}$As | 62.6 | |
| 110b | Al$_{0.87}$Ga$_{0.13}$As | 685 | n-DBR / 1-pair |
| 110a | Al$_{0.2}$Ga$_{0.8}$As | 610 | |
| 111 | Al$_{0.2}$Ga$_{0.8}$As | 1220 | Micro-cavity (λ/2) |
| 110b | Al$_{0.87}$Ga$_{0.13}$As | 685 | n-DBR / 9.5-pair |
| 110a | Al$_{0.2}$Ga$_{0.8}$As | 610 | |
| 102 | InGaP | | N contact (8λ) |

TRANSMISSIVE IMAGE MODULATOR INCLUDING STACKED DIODE STRUCTURE HAVING MULTI ABSORPTION MODES

CROSS-REFERENCE TO RELATED APPLICATION

This application claims priority from Korean Patent Application No. 10-2012-0001550, filed on Jan. 5, 2012, in the Korean Intellectual Property Office, the disclosure of which is incorporated herein in its entirety by reference.

BACKGROUND

1. Field

Apparatuses and methods consistent with exemplary embodiments relate to transmissive image modulators, and more particularly, to transmissive image modulators capable of modulating images across a wide bandwidth by employing a stacked diode structure having multi absorption modes.

2. Description of the Related Art

An image captured by using a common camera does not include information regarding a distance between the camera and an object. To embody a 3-dimensional (3D) image capturing apparatus, such as a 3D camera, an additional device for measuring distances from a plurality of points on surfaces of an object is necessary. Distance information with respect to an object may be acquired via a stereo vision method using two cameras or a triangulation method using a structured light and a camera. However, using the above-stated methods, the accuracy of distance information rapidly deteriorates as a distance to an object increases. Furthermore, the above methods depend on surface condition of the object, and thus, it is difficult to acquire precise distance information.

For acquisition of more precise distance information, a time-of-flight (TOF) method has been introduced. In the TOF method, a laser beam is emitted to an object and a period of time until light reflected by the object is received is measured by a light receiving unit. In the TOF method, light of a particular wavelength (e.g., near infrared ray having a 850 nm wavelength) is emitted to an object by using a light emitting diode (LED) or a laser diode (LD), a light of the same wavelength reflected by the object is received by a light receiving unit, and special processes for extracting distance information are performed. Various TOF methods have been introduced. For example, in a direct time measuring method, a pulse light is emitted to an object, a period of time until reception of light reflected by the object is measured by using a timer, and a distance to the object is calculated based on a result of the measurement. In a correlation method, a pulse light is emitted to an object and a distance to the object is measured based on the brightness of light reflected by the object. In a phase delay measuring method, a continuous wave (e.g., sine wave) of light is emitted to an object, a phase difference of light reflected by the object is detected, and the phase difference is converted into a distance to the object.

Furthermore, there are various types of phase delay measuring methods. From among these phase delay measuring methods, an external modulation method for modulating the amplitude of reflected light by using a light modulator and a method of measuring a phase delay by photographing the modulated reflected light by using an imaging device, such as a CCD or a CMOS, are useful for acquiring a high-resolution distance image. Using the external modulation method, a brightness image may be acquired by accumulating or sampling an amount of light incident onto an imaging device for a predetermined period of time, and phase difference and distance to an object may be calculated based on the brightness image. Although a common imaging device may be used as is for external modulation, a light modulator capable of rapidly modulating light at a frequency from dozens of MHz to hundreds of MHz is needed for acquiring a precise phase difference.

Examples of light modulators include an image intensifier or a transmissive light modulator using the Pockel effect or Kerr effect based on crystal optics. However, such light modulators feature large volumes, use high voltage of several kV, and are expensive.

Recently, a GaAs semiconductor-based light modulator, which is relatively easy to embody, is relatively small, and operates at a relatively low voltage, has been introduced. GaAs-based light modulators include a multiple quantum well (MQW) arranged between a P– electrode and an N– electrode and uses a phenomenon that light is absorbed in an MQW when a reverse bias voltage is applied to both PN electrodes. A GaAs-based light modulator features high-speed operation, relatively low driving voltage, and a large ON/OFF reflectivity difference (that is, contrast range). However, a GaAs-based light modulator features very narrow bandwidth from about 4 nm to about 5 nm.

A 3D camera uses a plurality of light sources, and there is slight deviation in center wavelengths of the light sources. Furthermore, the center wavelength of light emitted by a light source may change with temperature. In the same regard, a center absorption wavelength of a light modulator varies according to manufacturing process variables and temperature. Therefore, a light modulator capable of modulating light across a wide bandwidth is necessary for a 3D camera. However, there is a trade-off between an ON/OFF reflectivity difference and bandwidth, and thus, it is difficult to increase ON/OFF reflectivity difference and bandwidth simultaneously.

Meanwhile, since a reflective light modulator reflects modulated light, a light path for providing the modulated light to an imaging device (CCD or CMOS) is complicated, and thus, it is necessary to configure an additional optic system. However, since a transmissive light modulator transmits modulated light, configuration of an optic system may become relatively simple by using a transmissive light modulator. Like in the case of a reflective light modulator, there is also a trade-off between an ON/OFF reflectivity difference and bandwidth in a transmissive light modulator, and thus, it is important to simultaneously increase the ON/OFF reflectivity difference and bandwidth.

To increase the transmissivity difference and bandwidth, a MQW may be formed to have a greater thickness. However, if a thickness of an MQW increases, an driving voltage of a light modulator also increases. If an driving voltage of a light modulator increases, power consumption increases in proportion to the square of the driving voltage. Increased power consumption causes increased heat generated by an image modulator, and thus, the performance of the image modulator may deteriorate due to the generated heat. Therefore, researches are being made for improving the performance of a light modulator with a reduced driving voltage.

SUMMARY

One or more exemplary embodiments may provide transmissive light modulators which are capable of modulating images across a wide bandwidth, operate with relatively low driving voltages, and have high transmissivity difference.

Additional aspects will be set forth in part in the description which follows and, in part, will be apparent from the description, or may be learned by practice of the presented embodiments.

According to an aspect of an exemplary embodiment, a transmissive light modulator includes a first reflection layer; a first active layer, which is arranged on the first reflection layer and includes a plurality of quantum well layers and a plurality of barrier layers; a second reflection layer arranged on the first active layer; a second active layer, which is arranged on the second reflection layer and includes a plurality of quantum well layers and a plurality of barrier layers; and a third reflection layer arranged on the second active layer, wherein the first reflection layer and the third reflection layer are doped with a first type dopant, and the second reflection layer is doped with a second type dopant, which is electrically opposite to the first type dopant.

Each of the first active layer and the second active layer includes at least a first type quantum well layer and a second type quantum well layer having a thickness different from a thickness of the first quantum well layer.

The first active layer includes a plurality of first type quantum well layers and a plurality of second type quantum well layers.

The thickness of the first type quantum well layer is greater than the thickness of the second type quantum well layer, and a number of the first type quantum well layers is greater than a number of the second type quantum well layers.

The plurality of first type quantum well layers and the plurality of second type quantum well layers are alternately arranged, and each of the barrier layers is arranged between pairs of the first type quantum well layer and the second type quantum well layer.

The first active layer includes a first multiple quantum well (MQW) structure in which the first type quantum well layers and the barrier layers are alternately arranged and a second MQW structure in which the second type quantum well layers and the barrier layers are alternately arranged, and in the first active layer, the first MQW structure is arranged on the second MQW structure or vice versa.

The first active layer further includes a cladding layer interposed between the first reflection layer and the first active layer and a cladding layer interposed between the second reflection layer and the first active layer.

The second active layer includes a plurality of third type quantum well layers and a plurality of fourth type quantum well layers, and the third type quantum well layer and the fourth type quantum well layer have different thicknesses.

A thickness of the third type quantum well layer is greater than a thickness of the fourth type quantum well layer, and a number of the third type quantum well layers is greater than a number of the fourth type quantum well layers.

The plurality of third type quantum well layers and the plurality of fourth type quantum well layers are alternately arranged, and each of the plurality of barrier layers is arranged between pairs of the third type quantum well layer and the fourth type quantum well layer.

The second active layer includes a third MQW structure in which the third type quantum well layers and the barrier layers are alternately arranged and a fourth MQW structure in which the fourth type quantum well layers and the barrier layers are alternately arranged, and in the second active layer, the third MQW structure is arranged on the fourth MQW structure or vice versa.

The second active layer further includes a cladding layer interposed between the second reflection layer and the second active layer and a cladding layer interposed between the third reflection layer and the third active layer.

A thickness of the plurality of quantum well layers of the first active layer and a thickness of the plurality of quantum well layers of the second active layer are different from each other.

The first through third reflection layers are DBR layers each of which is formed by alternately and repeatedly stacking first type refraction layers and second type refraction layers, which each have an optical thickness of $\lambda/4$ (where, $\lambda$ is a resonating wavelength of the transmissive light modulator) and different refractive indexes.

The first type reflection layer and the third type reflection layer have the same reflectivity.

The transmissive light modulator further includes at least one first micro-cavity layer arranged in the first reflection layer; and at least one second micro-cavity layer arranged in the third reflection layer, wherein the first and second active layers and at least one of the first and second micro-cavity layers have optical thicknesses that are integer multiples of $\lambda/2$.

The first micro cavity layer is interposed between the first type refraction layer and the second type refraction layer of the first reflection layer, and the second micro cavity layer is interposed between the first type refraction layer and the second type refraction layer of the third reflection layer.

The first and second micro cavity layers are formed of the same material as the first type refraction layer or the second type refraction layer.

The transmissive light modulator further includes a first contact layer, which is arranged on type rear surface of the first reflection layer; a second contact layer, which is arranged on type top surface of the third reflection layer; and a third contact layer, which is arranged in the second reflection layer, wherein the third contact layer is arranged at a portion of the second reflection layer that is exposed by a partially removed portion of the second contact layer, the third reflection layer, and the second active layer.

The first through third contact layers are formed of GaAs or InGaP, the first and second contact layers are doped with a first type dopant, and the third contact layer is doped with a second type dopant.

The transmissive light modulator further includes first electrodes arranged on each of the first and second contact layers; and a second electrode arranged on the third contact layer.

The transmissive light modulator further includes an insulation layer formed around the first reflection layer, the first active layer, the second reflection layer, the second active layer, the third reflection layer, and the second contact layer, wherein the first electrodes are extend from the first contact layer onto the second contact layer around the lateral surfaces of the insulation layer.

The transmissive light modulator further includes a metal pattern, which is arranged on the second contact layer and is electrically connected to the first electrodes.

The transmissive light modulator further includes a substrate arranged on a rear surface of the first contact layer; and a transparent window, which penetrates a center portion of the substrate.

The transmissive light modulator further includes a transparent resin disposed on the second contact layer; and a transparent cover arranged on the transparent resin.

According to an aspect of another exemplary embodiment, a method of forming a transmissive light modulator on a substrate, the method includes forming a first contact layer on the substrate; forming the transmissive light modulator as described above on the first contact layer; forming the second contact layer on the third reflection layer; and forming a transparent window by removing the center portion of the substrate.

The first contact layer is formed of GaAs, and the forming the first contact layer on the substrate includes forming an AlAs buffer layer on the substrate; and forming the first contact layer on the AlAs buffer layer.

The forming the transparent window includes forming a first protective layer on a rear surface of the substrate and a second protective layer on a top surface of the second contact layer; forming a photoresist on an edge portion of the first protective layer and removing the center portion of the first protective layer to expose the substrate; removing the exposed portion of the substrate via dry etching without exposing the buffer layer; removing a remaining portion of the substrate via wet etching to expose the buffer layer; and removing the exposed buffer layer and the first and second protective layers.

The first contact layer is formed of InGaP.

The forming of the transparent window includes forming a first protective layer on a rear surface of the substrate and a second protective layer on a top surface of the second contact layer; forming a photoresist on an edge portion of the first protective layer and removing a center portion of the first protective layer to expose the substrate; removing the substrate via wet etching to expose the buffer layer; and removing the exposed buffer layer and the first and second protective layers.

BRIEF DESCRIPTION OF THE DRAWINGS

These and/or other exemplary aspects and advantages will become apparent and more readily appreciated from the following description of exemplary embodiments, taken in conjunction with the accompanying drawings of which:

FIG. 10 is a diagram showing an example layer structure and layer thicknesses of the transmissive light modulator according to an exemplary embodiment;

FIG. 11 shows an exemplary design of the transmissive light modulator;

FIG. 13 shows another exemplary design of the transmissive light modulator;

FIG. 15 shows another exemplary design of the transmissive light modulator;

FIG. 16 shows another exemplary design of the transmissive light modulator;

DETAILED DESCRIPTION

Figure 1:
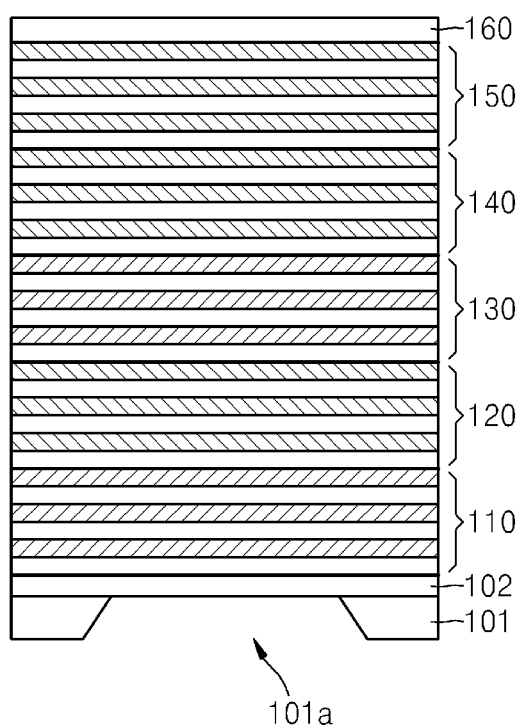
FIG. 1 is a schematic sectional view showing a stacked structure of a transmissive light modulator according to an exemplary embodiment.

Reference will now be made in detail to exemplary embodiments which are illustrated in the accompanying drawings, wherein like reference numerals refer to the like elements throughout. In this regard, the present embodiments may have different forms and should not be construed as being limited to the descriptions set forth herein. Accordingly, exemplary embodiments are merely described below, by referring to the figures, to explain aspects of the present description.

FIG. 1 is a schematic sectional view showing a stacked structure of a transmissive light modulator 100 according to an exemplary embodiment. Referring to FIG. 1, the transmissive light modulator 100 according to the present embodiment may include a substrate 101, a first contact layer 102 arranged on the substrate 101, a first distributed Bragg reflector (DBR) layer 110 arranged on the first contact layer 102, a first active layer 120 which has a multiquantum well (MQW) structure and is arranged on the first DBR layer 110, a second DBR layer 130 arranged on the first active layer 120, a second active layer 140 which has a MQW structure and is arranged on the second DBR layer 130, a third DBR layer 150 arranged on the second active layer 140, and a second contact layer 160 arranged on the third DBR layer 150.

The substrate 101 may be formed of updoped GaAs, for example. A transparent window 101a may be formed at the center of the substrate 101 so that light may pass through the transmissive light modulator 100. The transparent window 101a may formed by penetrating the center portion of the substrate 101 to expose the first contact layer 102.

The first and second active layers 120 and 140 are layers which absorb light and may have a MQW structure in which a plurality of quantum well layers and a plurality of barrier layers are alternately stacked. For example, the first and second active layers 120 and 140 may each include a plurality of barrier layers formed of $Al_{0.31}Ga_{0.69}As$ and a plurality of quantum well layers formed of GaAs. Particularly, the first and second active layers 120 and 140 may each include at least two types of quantum well layers having different thicknesses to increase bandwidth of the transmissive light modulator 100. The first and second active layers 120 and 140 may function as main cavities for Fabry-Perot resonance. Therefore, each of the first and second active layers 120 and 140 may be formed such that an optical thickness thereof (physical thickness multiplied by refraction index of a material constituting a corresponding layer) is equal to about an integer multiple of $\lambda/2$ (where $\lambda$ is wavelength of incident light to be modulated or wavelength of resonance). Therefore, the transmissive light modulator 100 according to the present embodiment may operate in a multiple absorption mode due to two main cavities.

The first through third DBR layers 110, 130, and 150 each have a structure in which low refraction layers having a relatively low refraction index and high refraction layers having a relatively high refraction index (higher than that of the low refraction layers) are alternately stacked. For example, the first through third DBR layers 110, 130, and 150 may be formed of a plurality of pairs of an $Al_xGa_{1-x}As$ layer and an $Al_yGa_{1-y}As$ layer which includes an $Al_xGa_{1-x}As$ layer as a high refraction layer and an $Al_yGa_{1-y}As$ layer as a low refraction layer (where $0<x<1, 0<y<1, x<y$). More particularly, the first through third DBR layers 110, 130, and 150 may each have a structure in which a plurality of pairs of an $Al_{0.2}Ga_{0.8}As$ layer and an $Al_{0.87}Ga_{0.13}As$ layer are repeatedly stacked.

When light of a particular wavelength is incident onto the first through third DBR layers 110, 130, and 150 having the multi-layer structure as described above, reflection occurs at the interface between two layers with different refraction indexes (that is, a low refraction layer and a high refraction layer) in the first through third DBR layers 110, 130, and 150. High reflectivity may be obtained by matching phases of all reflected light. The first through third DBR layers 110, 130, and 150 may be formed such that the optical thicknesses of high refraction layers and of the low refraction layers are equal to about odd number multiples of $\lambda/4$. Reflectivities of the first through third DBR layers 110, 130, and 150 may increase as the number of pairs formed by a low refraction layer and a high refraction layer increases.

Meanwhile, the first through third DBR layers 110, 130, and 150 may serve as electrodes so that an electric field for light absorption in the first and second active layers 120 and 140 may be generated. In other words, the first and second DBR layers 110 and 130 may serve as an electrode with respect to the first active layer 120, and the second and third DBR layers 130 and 150 may serve as an electrode with respect to the second active layer 140. The first and third DBR layers 110 and 150 may be doped with a first electric type dopant, whereas the second DBR layer 130 may be doped with a second electric type dopant, which is opposite to the first electric type dopant. For example, the first and third DBR layers 110 and 150 may be n-DBR layers doped with an n-type dopant, whereas the second DBR layer 130 may be a p-DBR layer doped with a p-type dopant. Alternatively, the first and third DBR layers 110 and 150 may be doped with a p-type dopant and the second DBR layer 130 may be doped with an n-type dopant. If a layer is doped with an n-type dopant, the layer may be doped with silicon (Si) at a concentration of about $3.18\times10^{18}/cm^3$. If a layer is doped with an p-type dopant, the layer may be doped with beryllium (Be) at a concentration of from about $4.6\times10^{18}/cm^3$ to about $6.5\times10^{18}/cm^3$.

The first and second contact layers 102 and 160 are layers to be connected to electrodes (not shown) for applying voltages to the first and second active layers 120 and 140. If the first and second DBR layers 110 and 150 are n-DBR layers doped with an n-type dopant, the first and second contact layers 102 and 160 may be formed of n-GaAs or n-InGaP. If the first and second DBR layers 110 and 150 are p-DBR layers doped with a p-type dopant, the first and second contact layers 102 and 160 may be formed of p-GaAs or p-InGaP.

Therefore, the transmissive light modulator 100 according to the present embodiment may have an N-I-P-I-N structure including the n-type first DBR layer 110, the undoped first active layer 120, the p-type second DBR layer 130, the updoped second active layer 140, and the n-type third DBR layer 150 or a P-I-N-I-P structure including the p-type first DBR layer 110, the undoped first active layer 120, the n-type second DBR layer 130, the undoped second active layer 140, and the p-type third DBR layer 150. In this perspective, it may be considered that the transmissive light modulator 100 has a stacked diode structure in which two diodes are stacked to be electrically connected to each other in parallel. Generally, a driving voltage of a light modulator is proportional to a thickness of an active layer. However, since the transmissive light modulator 100 according to the present embodiment includes the two active layers 120 and 140 that are electrically connected to each other in parallel, a driving voltage of the transmissive light modulator 100 may be about half of that of a transmissive light modulator including a single active layer having a thickness equal to the sum of the thicknesses of the two active layers 120 and 140. Therefore, the transmissive light modulator 100 consumes relatively little power, and thus, deterioration of performance of the transmissive light modulator 100 due to heat generation may be significantly reduced.

Figure 2:
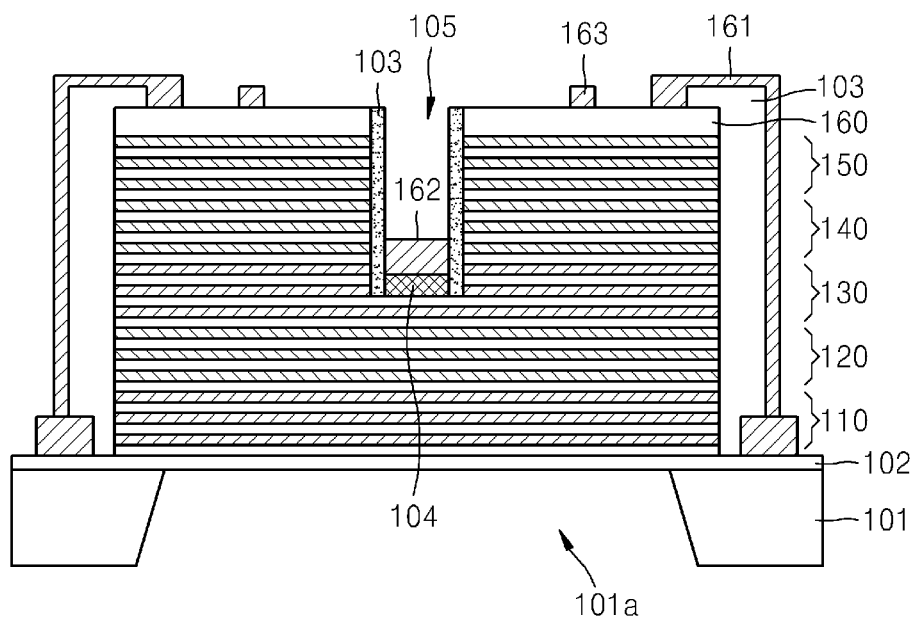
FIG. 2 is a schematic sectional view of an exemplary structure for connecting electrodes to the transmissive light modulator shown in FIG. 1.

As described above, the transmissive light modulator 100 according to the present embodiment has an N-I-P-I-N structure or a P-I-N-I-P structure, the transmissive light modulator 100 may be designed in consideration of a structure for connecting electrodes to the second DBR layer 130 arranged at the middle of the stacked structure of the transmissive light modulator 100. FIG. 2 is a schematic sectional view of an exemplary structure for connecting electrodes to the transmissive light modulator 100 shown in FIG. 1, and FIG. 3 is a schematic plan view of the same structure as shown in FIG. 2.

Figure 3:
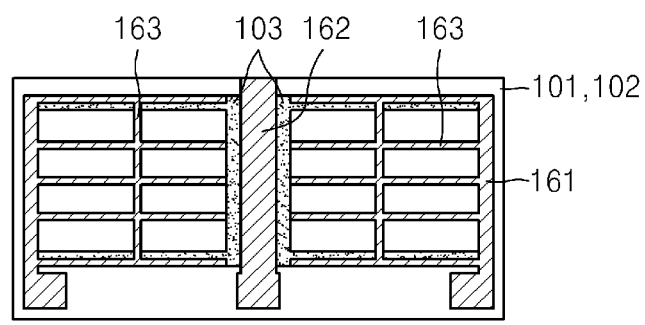
FIG. 3 is a schematic plan view of the structure as shown in FIG. 2.

Referring to FIGS. 2 and 3, a stacked structure including the first DBR layer 110, the first active layer 120, the second DBR layer 130, the second active layer 140, the third DBR layer 150, and the second contact layer 160 is arranged on the substrate 101 and the first contact layer 102. Furthermore, a first electrode 161 for applying a voltage to the first DBR layer 110 may be formed on the first contact layer 102. Since the first DBR layer 110 and the third DBR layer 150 are doped with the same type of dopant, the first electrode 161 may also be formed on the second contact layer 160. The first electrode 161 may be formed to extend from the first contact layer 102 to the second contact layer 160. For electric insulation from the first electrode 161, an insulation layer 103 may be formed around the stacked structure including the first DBR layer 110, the first active layer 120, the second DBR layer 130, the second active layer 140, the third DBR layer 150, and the second contact layer 160. In this case, the first electrode 161 may extend from the first contact layer 102 to the second contact layer 160 along a sidewall of the insulation layer 103. A metal pattern 163 electrically connected to the first electrode 161 may be further formed on the top surface of the second contact layer 160. The metal pattern 163 may minimize loss of light incident onto the transmissive light modulator 100 and may efficiently supply a current to the third DBR layer 150. For example, the metal pattern 163 may be formed to have a fishbone shape, a matrix shape, or a mesh grid shape.

Furthermore, to connect electrodes to the second DBR layer 130, a trench 105 which penetrates through the second contact layer 160, the third DBR layer 150, and the second active layer 140 may be formed. Therefore, the second DBR layer 130 is exposed to outside via the bottom surface of the trench 105. Furthermore, the insulation layer 103 is formed on the inner walls of the trench 105 for electric insulation. A third contact layer 104 and a second electrode 162 may be sequentially formed on the bottom surface of the trench 105. If the second DBR layer 130 is doped with an n-type dopant, the third contact layer 104 may be formed of n-GaAs. If the second DBR layer 130 is doped with a p-type dopant, the third contact layer 104 may be formed of p-GaAs. Although FIG. 2 shows that the third contact layer 104 is formed only on the bottom surface of the trench 105, the third contact layer 104 may be stacked in the second DBR layer 130. For example, the second DBR layer 130 has a structure in which high refraction layers and low refraction layers are alternately stacked a plurality of times, where the third contact layer 104 may be interposed between one of the high refraction layers and one of the low refraction layers. In this case, the third contact layer 104 may function as an etch-stop layer during an etching process for formation of the trench 105. The third contact layer 104 may be formed to have a thickness from about 30 nm to about 100 nm, for example.

Figure 4:
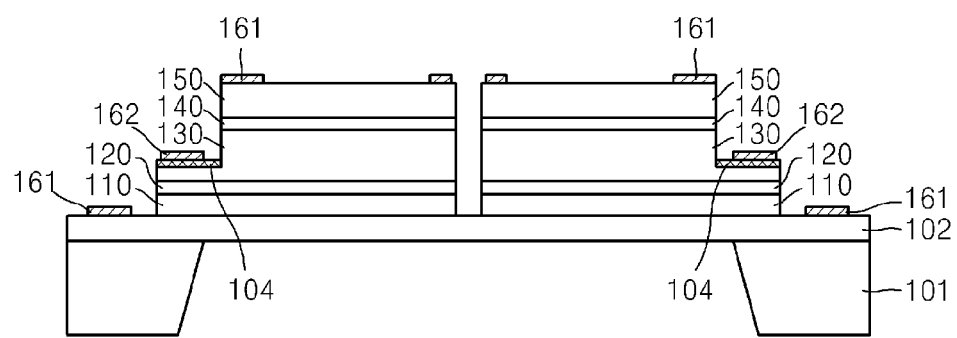
FIG. 4 is a schematic sectional view of another exemplary structure for connecting electrodes to the transmissive light modulator shown in FIG. 1.
Figure 5A:
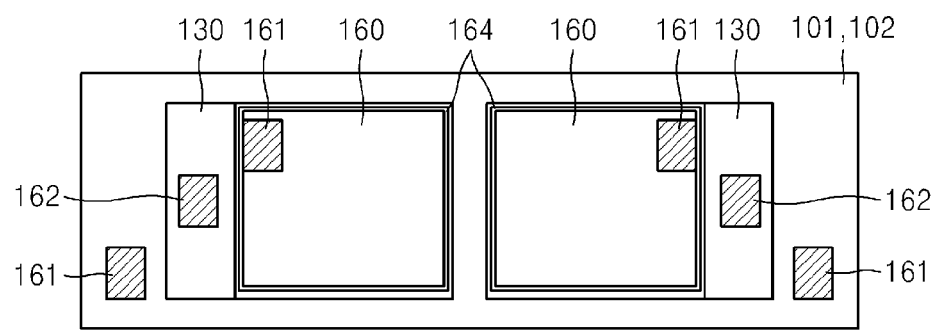
FIG. 5A is a schematic plan view of another example structure for connecting electrodes to the transmissive light modulator shown in FIG. 1.

FIG. 4 is a schematic sectional view of another exemplary structure for connecting electrodes to the transmissive light modulator 100 shown in FIG. 1, and FIG. 5A is a schematic plan view of the same structure.

Referring to FIGS. 4 and 5A, a stacked structure including the first DBR layer 110, the first active layer 120, the second DBR layer 130, the second active layer 140, the third DBR layer 150, and the second contact layer 160 is arranged on the substrate 101 and the first contact layer 102. The stacked structure may be split into at least two cells. Although FIGS. 4 and 5A shows only two cells, a plurality of cells may be arranged in an array shape (e.g., an N×M matrix shape, where N and M are natural numbers). If a stacked structure is formed as a single structure having a large area, increased capacitance may deteriorate the operating speed of the transmissive light modulator 100. Therefore, as a plurality of cells having relatively small areas are arranged in an array shape to form the transmissive light modulator 100, the transmissive light modulator 100 may operate at a high speed. Not only the transmissive light modulator 100 shown in FIG. 4, but also the transmissive light modulator 100 shown in FIG. 2 may be formed as an array of a plurality of cells.

In the structure described above, the first electrodes 161 may be respectively formed on the first contact layer 102 and the second contact layer 160. The first electrodes 161 are arranged for applying voltages to the first and second DBR layers 110 and 150. Furthermore, edge portions of the second contact layer 160, third DBR layer 150, and second active layer 140 may be etched to expose a portion of the second DBR layer 130 to the outside. The third contact layer 104 and the second electrode 162 may be sequentially formed on the exposed portion of the second DBR layer 130. As described above, although FIG. 4 shows that the third contact layer 104 is formed only on the exposed portion of the second DBR layer 130, the third contact layer 104 may be interposed between one of high refraction layers and one of low refraction layers constituting the second DBR layer 130. In this case, the third contact layer 104 may function as an etch-stop layer during an etching process for etching the second contact layer 160, the third DBR layer 150, and the second active layer 140.

Figure 5B:
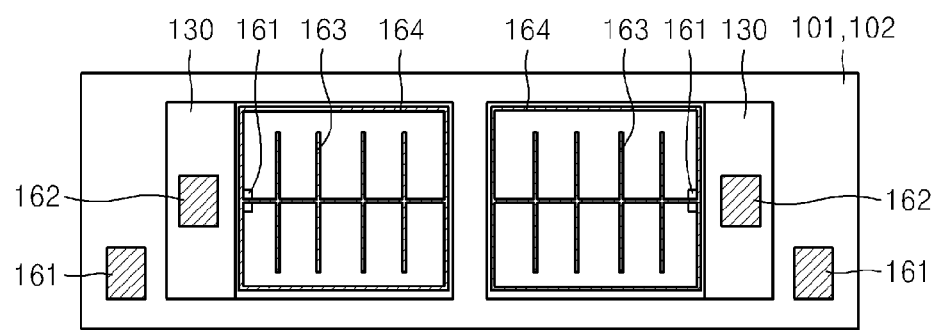
FIG. 5B is a schematic plan view of another exemplary structure for connecting electrodes to the transmissive light modulator shown in FIG. 1.

Referring to FIG. 5A, a metal line 164, which is electrically connected to the first electrode 161, may be further formed on the second contact layer 160 to efficiently supply a current to the third DBR layer 150. For example, the metal line 164 may be formed as a rectangular ring around the second contact layer 160. If the transmissive light modulator 100 has a P-I-N-I-P structure, the second contact layer 160 may be formed of p-GaAs. Since p-GaAs has larger surface resistance than n-GaAs, the metal pattern 163 that is electrically connected to the first electrode 161 may be further formed on the second contact layer 160 for further improving current supply efficiency, as shown in FIG. 5B. As described above with reference to FIG. 3, the metal pattern 163 may be formed to have a fishbone shape, a matrix shape, or a mesh grid shape.

In the structure described above, light incident via the top surface of the transmissive light modulator 100 reciprocates between the third DBR layer 150 and the second DBR layer 130 and resonates in the second active layer 140. Furthermore, the light incident via the top surface of the transmissive light modulator 100 may reciprocate between the second DBR layer 130 and the first DBR layer 110 and resonate in the first active layer 120. Next, light of a particular wavelength $\lambda$ satisfying a resonating condition may be transmitted through the transmissive light modulator 100. In this case, the first and second active layers 120 and 140 function as main cavities for Fabry-Perot resonance. An intensity of transmitted light may be modulated by adjusting light absorption in the first and second active layers 120 and 140 by applying a reverse bias voltage to the transmissive light modulator 100. According to the present embodiment, the transmissive light modulator 100 includes two main cavities, and the first and second active layers 120 and 140 may include at least two types of quantum well layers having different thicknesses. Therefore, the transmissive light modulator 100 may operate in a Fabry-Perot resonance mode. By using the Fabry-Perot resonance mode, a transmission bandwidth of transmissive light modulator 100 may be increased.

FIGS. 6 through 9B are diagrams showing the mechanism of increasing a transmission bandwidth by using the Fabry-Perot resonance mode.

Figure 6:
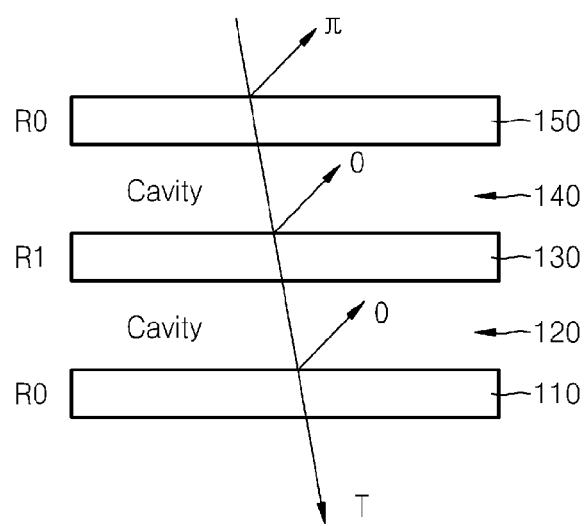
FIG. 6 is a schematic view of resonance structure of the transmissive light modulator shown in FIG. 1.

First, FIG. 6 is a schematic view of resonance structure of the transmissive light modulator 100 shown in FIG. 1. Referring to FIG. 6, the first and second active layers 120 and 140, which function as cavities, are respectively arranged between the first through third DBR layers 110, 130, and 150, which function as highly-reflective mirrors. Since the first through third DBR layers 110, 130, and 150 may be symmetrically arranged, the first and second DBR layers 110 and 150 may have the same reflectivity R0, whereas the reflectivity R1 of the second DBR layer 130 may be higher than the reflectivity R0 of the first and second DBR layers 110 and 150.

Figure 7A:
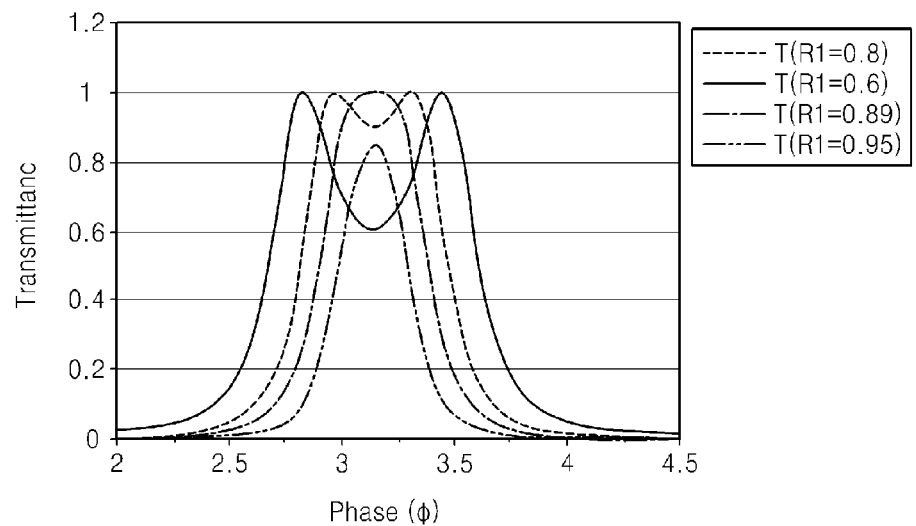
FIGS. 7A and 7B are graphs showing optical properties due to the resonance structure shown in FIG. 6.
Figure 7B:
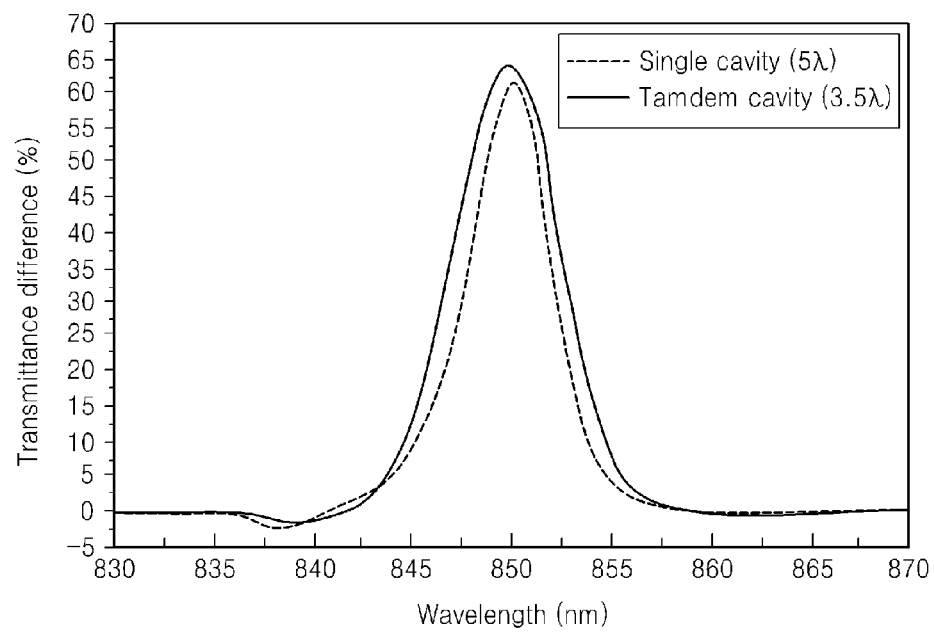

In the structure described above, when light is incident via the top surface of the third DBR layer 150, the reflected light is divided into three portions having different phases. In other words, light reflected by the third DBR layer 150 has a phase 7E, whereas light which resonates in the second active layer 140 and is reflected by the second DBR layer 130 and light that resonates in the first active layer 120 and is reflected by the first DBR layer 110 both have zero phase. The three reflected light portions may offset each other. Next, light of a particular wavelength $\lambda$ satisfying a resonating condition exits via the bottom surface of the first DBR layer 110. In this case, as shown in FIG. 7, two transmissivity peaks may be formed due to two cavities. In FIG. 7, it is assumed that light absorption in the two active layers 120 and 140 is zero and the reflectivity R0 of the first and second DBR layers 110 and 150 is 0.5. The interval between two transmissivity peaks may vary according to the reflectivity R1 of the second DBR layer 130. For example, as the reflectivity R1 of the second DBR layer 130 increases, the interval between two transmissivity peaks becomes narrower and more flat-top transmissivity characteristics appear around the transmissivity peaks.

The transmission bandwidth of the transmissive light modulator 100 is also affected by the light absorption properties of the first and second active layers 120 and 140. Particularly, a transmissivity difference indicating a light modulation performance of the transmissive light modulator 100 (that is, a difference between a transmissivity of the transmissive light modulator 100 when no voltage is applied thereto and a transmissivity of the transmissive light modulator 100 when a voltage is applied thereto) may be significantly affected by the light absorption properties of the first and second active layers 120 and 140. The light absorption properties of the first and second active layers 120 and 140 may depend on the thicknesses and material compositions of the quantum well layer and the barrier layer. For example, when other conditions are maintained constant and a thickness of the quantum well layer increases, a peak of an absorption coefficient moves toward longer wavelengths.

Figure 8A:
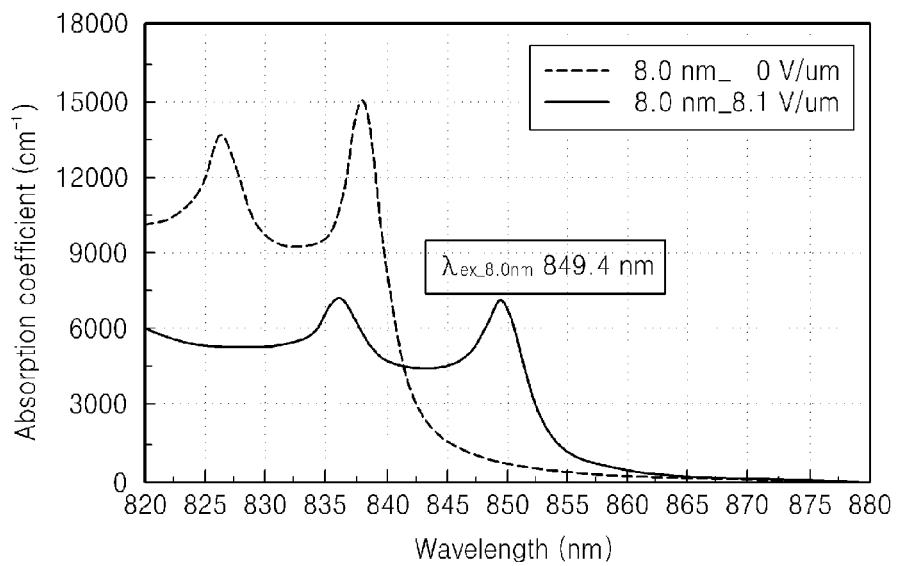
FIGS. 8A and 8B are graphs showing light absorption properties of active layers in a case where only quantum well layers of a single type are arranged in the active layers.
Figure 8B:
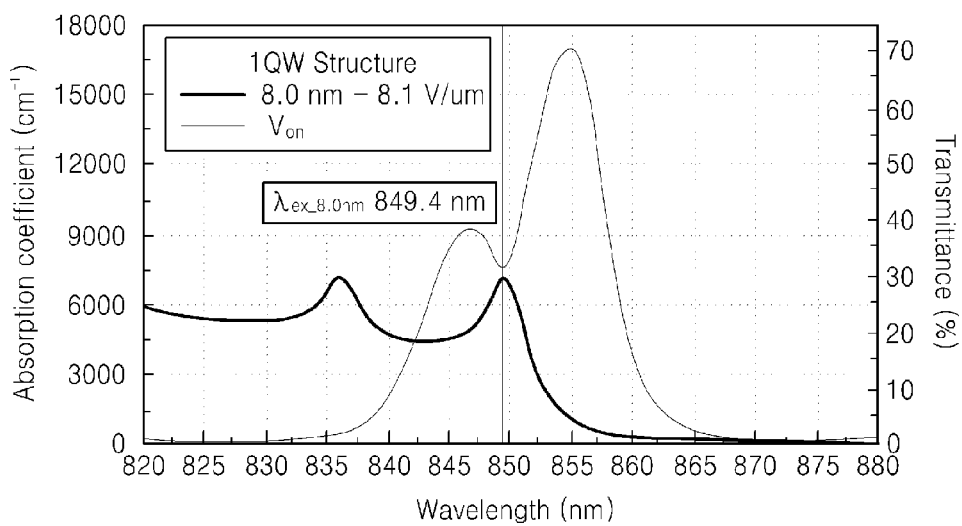

FIGS. 8A and 8B are graphs showing light absorption properties of the active layers 120 and 140 in a case in which only quantum well layers (e.g., the quantum well layers having a thickness of 8 nm) of a single type are arranged in the active layers 120 and 140. Here, it is assumed that the active layers 120 and 140 have a resonating wavelength of 850 nm. First, referring to FIG. 8A, when no voltage is applied to the transmissive light modulator 100, as indicated by the broken-line graph, the active layers 120 and 140 exhibit exciton absorption at a wavelength shorter than the resonating wavelength and exhibit little absorption at the resonating wavelength. When a reverse bias voltage (e.g., −8.1V/um) is applied to the transmissive light modulator 100, as indicated by the solid-line graph, the exciton peak moves toward longer wavelengths and intensity thereof decreases due to the Stark effect. Here, the exciton peak (849.4 nm) becomes almost identical to the resonating wavelength. Therefore, as shown in FIG. 8B, transmissivity at the resonating wavelength decreases.

Figure 9A:
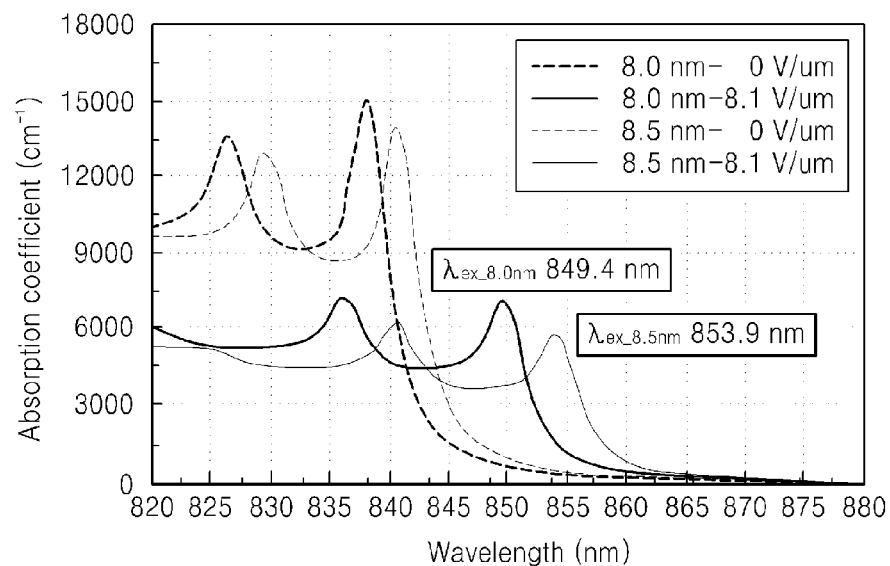
FIGS. 9A and 9B are graphs showing light absorption properties of the active layers in a case where two types of quantum well layers are arranged in the active layers.
Figure 9B:
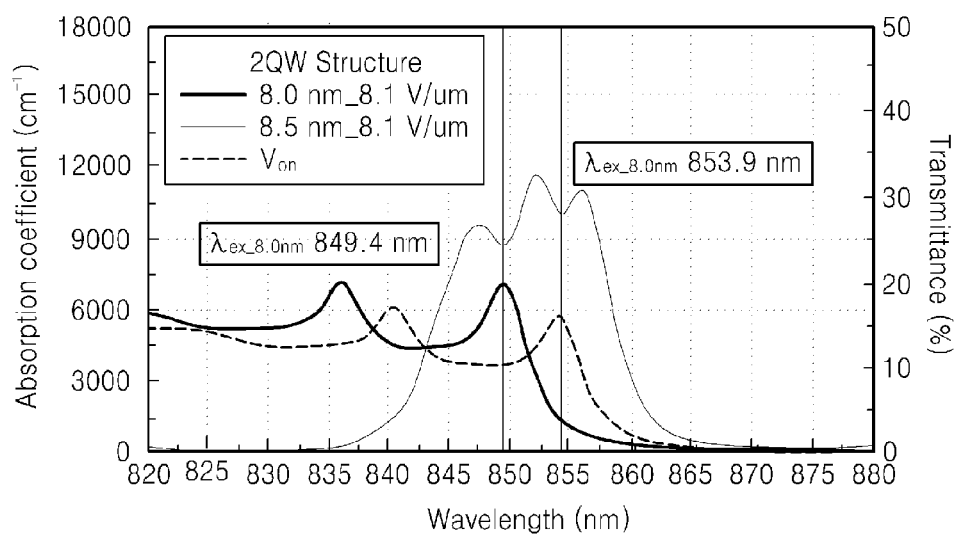

Meanwhile, FIGS. 9A and 9B are graphs showing light absorption properties of the active layers 120 and 140 in a case in which two types of quantum well layers having different thicknesses (e.g., the quantum well layers respectively having thicknesses of 8 nm and 8.5 nm) are arranged in the active layers 120 and 140. Here, it is also assumed that the active layers 120 and 140 are designed to have a resonating wavelength of 850 nm. Referring to FIG. 9A, the quantum well layer having the thickness of 8 nm and the quantum well layer having the thickness of 8.6 nm exhibit exciton absorption, respectively. When a reverse bias voltage is applied to the transmissive light modulator 100, each exciton peak moves toward longer wavelengths. Here, the exciton peak of the quantum well layer having the thickness of 8 nm may move to 849.4 nm, whereas the exciton peak of the quantum well layer having the thickness of 8.5 nm may move to 853.9 nm. As a result, as shown in FIG. 9B, low transmissivity may be acquired with respect to relatively wide range of wavelengths due to the two exciton peaks around the resonating wavelength.

FIG. 10 is a diagram showing an exemplary layer structure of the transmissive light modulator 100 according to an exemplary embodiment that may be configured in consideration of the matters described above and thickness of the layer. The transmissive light modulator 100 shown in FIG. 10 is formed of a GaAs compound semiconductor to have a center absorption wavelength around 850 nm. Furthermore, the transmissive light modulator 100 shown in FIG. 10 is designed to have an N-I-P-I-N structure including the n-type first DBR layer 110, the undoped first active layer 120, the p-type second DBR layer 130, the undoped second active layer 140, and the n-type third DBR layer 150. However, the materials and thicknesses of the layers shown in FIG. 10 are just examples, and the present embodiment is not limited thereto.

Referring to FIG. 10, the second contact layer 160, which functions as an n-contact layer, may be formed of n-GaAs. Since a GaAs-based material features small surface oxidation rate and a bandgap, a GaAs-based material is favorable for forming an ohmic contact during formation of electrodes. A thickness of the second contact layer 160 may be about 100 Å in consideration of absorption loss of incident light.

A third DBR layer 150 is arranged below the second contact layer 160. The third DBR layer 150 has a structure in which high refraction layers 150a and low refraction layers 150b are alternately stacked from up to down several times. For example, the high refraction layer 150a may be formed of $Al_{0.2}Ga_{0.8}As$. In this case, thickness of the high refraction layer 150a may be about 610 Å. In this case, optical thickness of the high refraction layers 150a may be about $\lambda/4$ ($\lambda=850$ nm). Furthermore, the low refraction layers 150b may be formed of $Al_{0.87}Ga_{0.13}As$, for example, where thicknesses of the low refraction layers 150b may be about 685 Å. In this case, optical thicknesses of the low refraction layers 150b may be about $\lambda/4$. However, materials constituting the high refraction layers 150a and the low refraction layers 150b are not limited thereto, and the high refraction layers 150a and the low refraction layers 150b may be formed of materials of other types and other compositions. Furthermore, as described above, the third DBR layer 150 also functions as a current flowing path. Therefore, the high refraction layers 150a and the low refraction layers 150b may be doped with an n-type dopant, for example, Si.

The second active layer 140, which absorbs light and functions as a main cavity, is arranged below the third DBR layer 150. The second active layer 140 may include a plurality of quantum well layers 142 and 144 and a plurality of barrier layers 143 arranged between the plurality of quantum well layers 142 and 144. For example, the quantum well layers 142 and 144 may be formed of undoped GaAs, and the barrier layer 143 may be formed of undoped $Al_{0.81}Ga_{0.69}As$. In the present embodiment, the second active layer 140 may includes a third quantum well layer 142 and a fourth quantum well layer 144 having different thicknesses. For example, the third quantum well layer 142, the barrier layer 143, the fourth quantum well layer 144, and the barrier layer 143 may be sequentially stacked. In other words, the third quantum well layer 142 and the fourth quantum well layer 144 are alternately arranged, and the barrier layer 143 may be interposed between the third quantum well layer 142 and the fourth quantum well layer 144. Alternatively, after the third quantum well layer 142 and the barrier layer 143 are alternately arranged, the fourth quantum well layer 144 and the barrier layer 143 may be alternately arranged. In other words, the second active layer 140 may include a third MQW structure in which the third quantum well layer 142 and the barrier layer 143 are alternately arranged and a fourth MQW structure in which the fourth quantum well layer 144 and the barrier layer 143 are alternately arranged, where, in the second active layer 140, the third MQW structure may be arranged on the fourth MQW structure or vice versa.

As described above, two exciton peaks may occur around the resonating wavelength by arranging at least two types of quantum well layers 142 and 144 having different thicknesses. Therefore, a bandwidth of the transmissive light modulator 100 may be increased. Furthermore, cladding layers 141 may be arranged between the third quantum well layer 142 and the third DBR layer 150 and between the fourth quantum well layer 144 and the second DBR layer 130. The cladding layer 141 is a layer for minimizing light loss due to differences between refractive indexes of the quantum well layers 142 and 144 and the third and second DBR layers 150 and 130. Here, the cladding layer 141 may be formed of a material having a refractive index between refractive indexes of the quantum well layers 142 and 144 and refractive index indexes of the low refraction layers 150b and 130b. For example, the cladding layer 141 may be formed of the same material constituting the barrier layer 143, that is, $Al_{0.31}Ga_{0.69}As$.

An optical thickness of the second active layer 140, which functions as a main cavity, may be an integer multiple of $\lambda/2$. For example, an optical thickness of the second active layer 140 may be $\lambda$, $1.5\lambda$, $2\lambda$, $2.5\lambda$, or $3\lambda$. If the second active layer 140 becomes thicker, absorption rate increases and capacitance of the transmissive light modulator 100 decreases. However, there are trade-offs in that a process for manufacturing the light modulator becomes complicated and driving voltage of the transmissive light modulator 100 increases. An optical thickness of the second active layer 140 may be adjusted according to numbers and thickness of the quantum well layers 142 and 144 and the barrier layers 143 and thickness of the cladding layer 141. For example, after the numbers and thickness of the quantum well layers 142 and 144 and the barrier layers 143 are set to acquire desired absorption properties, thickness of the cladding layer 141 may be selected, such that optical thickness of the entire second active layer 140 including the cladding layers 141 becomes $\lambda$, $1.5\lambda$, $2\lambda$, $2.5\lambda$, or $3\lambda$.

Furthermore, the second DBR layer 130 is arranged below the second active layer 140. The second DBR layer 130 may include low refraction layers 130b, high refraction layers 130a, and phase matching layers 132 that are repeatedly stacked from up to down several times. For example, the high refraction layer 130a may be formed of $Al_{0.2}Ga_{0.8}As$ to have a thickness about 610 Å, whereas the low refraction layer 130b may be formed of $Al_{0.87}Ga_{0.13}As$ to have a thickness about 685 Å. The phase matching layer 132 having an optical thickness of $\lambda/4$ may be arranged at the bottommost portion of the second DBR layer 130. The phase matching layer 132 may be formed of a same material as the low refraction layer 130b, for example. The low refraction layers 130b, the high refraction layers 130a, and the phase matching layers 132 of the second DBR layer 130 may be doped with a p-type dopant, for example, Be. Although FIG. 10 shows that the phase matching layers 132 are arranged only in the second DBR layer 130, the present embodiment is not limited thereto. According to conditions for designing the transmissive light modulator 100, the phase matching layers 132 may also arranged in the first DBR layer 110 or the third DBR layer 150.

The first active layer 120 may be arranged below the second DBR layer 130. The first active layer 120 may have the same structure as the second active layer 140. For example, the first active layer 120 may include a plurality of quantum well layers 122 and 124 and a plurality of barrier layers 123 arranged therebetween. The quantum well layers 122 and 124 may be formed of undoped GaAs, whereas the barrier layer 123 may be formed of undoped $Al_{0.81}Ga_{0.69}As$. Furthermore, the first active layer 120 may include a first quantum well layer 122 and a second quantum well layer 124 having different thicknesses. For example, the first quantum well layer 122, the barrier layer 123, the second MQW layer 124, and the barrier layer 123 may be sequentially stacked. In other words, the first quantum well layer 122 and the second quantum well layer 124 may be alternately arranged, and the barrier layer 123 may be arranged between the first quantum well layer 122 and the second quantum well layer 124. Alternatively, after the first quantum well layer 122 and the barrier layer 123 are alternately arranged, the second quantum well layer 124 and the barrier layer 123 may be alternately arranged. In other words, the first active layer 120 may include a first MQW structure in which the first quantum well layer 122 and the barrier layer 123 are alternately arranged and a second MQW structure in which the second quantum well layer 124 and the barrier layer 123 are alternately arranged, where, in the first active layer 120, the first MQW structure may be arranged on the second MQW structure or vice versa.

Next, cladding layers 121 may be arranged between the first quantum well layer 122 and the second DBR layer 130 and between the second quantum well layer 124 and the first DBR layer 130. The cladding layer 121 may be formed of the same material constituting the barrier layer 123, that is, $Al_{0.31}Ga_{0.69}As$. An optical thickness of the first active layer 120, which functions as a main cavity, may be an integer multiple of $\lambda/2$. For example, an optical thickness of the first active layer 120 may be $\lambda$, $1.5\lambda$, $2\lambda$, $2.5\lambda$, or $3\lambda$.

Furthermore, the first DBR layer 110 is arranged below the first active layer 120. The first DBR layer 110 may include low refraction layers 110b and high refraction layers 110a that are repeatedly stacked from up to down several times. Like the second and third DBR layers 130 and 150, the high refraction layer 110a may be formed of $Al_{0.2}Ga_{0.8}As$ to have a thickness about 610 Å, whereas the low refraction layer 110b may be formed of $Al_{0.87}Ga_{0.13}As$ to have a thickness about 685 Å.

The first contact layer 102, which is formed of n-GaAs and has a thickness of about 100 Å may be arranged below the first DBR layer 110. The first contact layer 102 may be formed directly on the GaAs substrate 101 or an AlAs buffer layer may be interposed between the GaAs substrate 101 and the first contact layer 102. Furthermore, instead of the AlAs buffer layer and an n-GaAs contact layer, InGaP may be used as the first contact layer 102. The transparent window 101a may be formed at the center of the GaAs substrate 101 to transmit light without loss. The transparent window 101a may be air, for example.

Each of the thin-film layers described above, which include the first DBR layer 110, the first active layer 120, the second DBR layer 130, the second active layer 140, and the third DBR layer 150, may be epitaxially-grown by using molecular beam epitaxy (MBE) technique. Here, to grow each of the thin-film layers to precise thickness, each of the thin-film layers may be measured and grown simultaneously via in-situ optical reflectometry. In this regard, the first DBR layer 110, the first active layer 120, the second DBR layer 130, the second active layer 140, and the third DBR layer 150 may be referred to as an "N-I-P-I-N epitaxial structure.

As shown in FIG. 10, the transmissive light modulator 100 may be symmetrically formed around the second DBR layer 130. For example, the first DBR layer 110 and the third DBR layer 150 may have a same reflectivity, and the first active layer 120 and the second active layer 140 may have a same structure and a same thickness. the reflectivity of each of the DBR layers 110, 130, and 150 may be determined based on the number of pairs of a high refraction layer and a low refraction layer therein. In FIG. 10, the reference numerals R1, R2, and R3 indicate numbers of pairs of a high refraction layer and a low refraction layer in the first through third DBR layers 110, 130, and 150, respectively. The numbers R1, R2, R3 may be suitably selected according to desired optical properties of the transmissive light modulator 100.

Furthermore, the reference numerals X1 and X2 in FIG. 10 indicate the thickness of the first and third quantum well layers 122 and 142 and the thickness of the second and fourth quantum well layers 124 and 144, respectively, where the thicknesses may be selected from among 7 nm, 7.5 nm, 8 nm, and 8.5 nm, for example. Although FIG. 10 shows that the first and third quantum well layers 122 and 142 have the same thickness and that the second and fourth quantum well layers 124 and 144 have the same thickness, the first through fourth quantum well layers 122, 124, 142, and 144 may all have different thicknesses. Furthermore, the reference numeral Y' indicates a number of the quantum well layers 122, 124, 142, and 144 in each of the active layers 120 and 140, and the reference numeral Y-λ indicates the overall optical thickness of each of the active layers 120 and 140. The optical thickness Y-λ may be selected from among 1λ, 1.5λ, 2λ, 2.5λ, and 3λ, for example. The reference numeral Y" indicates thickness of the cladding layers 121 and 141. When X1, X2, Y', Y are determined, the thickness Y" of the cladding layers 121 and 141 may be determined together.

In an example of symmetric designs shown in FIG. 10, the first quantum well layer 122 and the second quantum well layer 124 having different thicknesses are arranged in the first active layer 120, whereas the third quantum well layer 142 and the fourth quantum well layer 144 having different thicknesses are arranged in the second active layer 140. Alternatively, single type quantum well layers having the same thickness may be arranged in the first active layer 120, whereas single type quantum well layers having the same thickness, which is different from that of the quantum well layer arranged in the first active layer 120, may be arranged in the second active layer 140.

FIG. 11 shows an exemplary design of the transmissive light modulator 100. Referring to FIG. 11, the first active layer 120 may include 29 first quantum well layers 122, each of which has a thickness of 85 Å, 28 second quantum well layers 124, each of which has a thickness of 80 Å, and the cladding layer 121 having a thickness of 36 Å. In the this regard, the second active layer 140 may include 29 third quantum well layers 142, each of which has a thickness of 85 Å, 28 fourth quantum well layers 144, each of which has a thickness of 80 Å, and the cladding layer 141 having a thickness of 36 Å. In this case, an optical thickness of the first active layer 120 and the second active layer 140 may be about 3λ. As shown in FIG. 11, to improve light absorption of the transmissive light modulator 100 when a voltage is applied thereto, a number of first and third quantum well layers 122 and 142 having a relatively large thickness may be greater than a number of the second and fourth quantum well layers 124 and 144. Furthermore, each of the first DBR layer 110 and the third DBR layer 150 may include two pairs of a high refraction layer and a low refraction layer, whereas the second DBR layer 130 may include 11 pairs of a high refraction layer and a low refraction layer. A driving voltage of the transmissive light modulator 100 having the structure as described above may be about 5.8 V.

Figure 12:
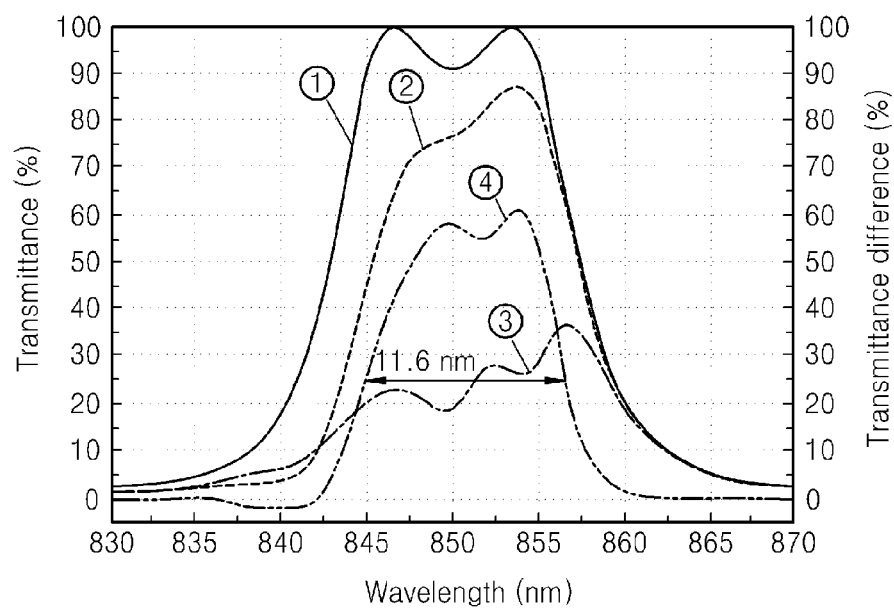
FIG. 12 is a graph showing optical properties of the transmissive light modulator shown in FIG. 11.

FIG. 12 is a graph showing optical properties of the transmissive light modulator 100 shown in FIG. 11. In FIG. 12, the graph ① indicates transmissivities according to wavelengths in a case where it is assumed that no light is absorbed by the first and second active layers 120 and 140. Furthermore, the graph ② indicates transmissivities when no voltage is applied to the transmissive light modulator 100, whereas the graph ③ indicates transmissivities when a reverse bias voltage is applied to the transmissive light modulator 100. Finally, the graph ④ indicates differences between transmissivities indicated by graphs ② and ③ (referred to hereinafter as transmissivity difference(s)). As the transmissivity difference indicated by the graph ④ is greater and bandwidth of the transmissivity differences (e.g., full width at half maximum) becomes wider, light modulating performance of the transmissive light modulator 100 may be improved. Referring to the graph ④, around the resonating wavelength, the maximum transmissivity difference is nearly 60% and bandwidth of transmissivity differences is about 11.6 nm.

FIG. 13 shows another exemplary design of a transmissive light modulator 100. Referring to FIG. 13, the first active layer 120 may include 30 first quantum well layers 122, each of which has a thickness of 70 Å, 32 second quantum well layers 124, each of which has a thickness of 75 Å, and the cladding layer 121 having a thickness of 56 Å. The second active layer 140 may also include 30 third quantum well layers 142, each of which has a thickness of 70 Å, 32 fourth quantum well layers 144, each of which has a thickness of 75 Å, and the cladding layer 141 having a thickness of 56 Å. In this case, the optical thickness of the first active layer 120 and the second active layer 140 may be about 3λ. Furthermore, each of the first DBR layer 110 and the third DBR layer 150 includes 2 pairs of a high refraction layer and a low refraction layer, whereas the second DBR layer 130 may include 11 pairs of a high refraction layer and a low refraction layer. The driving voltage of the transmissive light modulator 100 having the structure as described above may be about 9.2 V.

Figure 14:
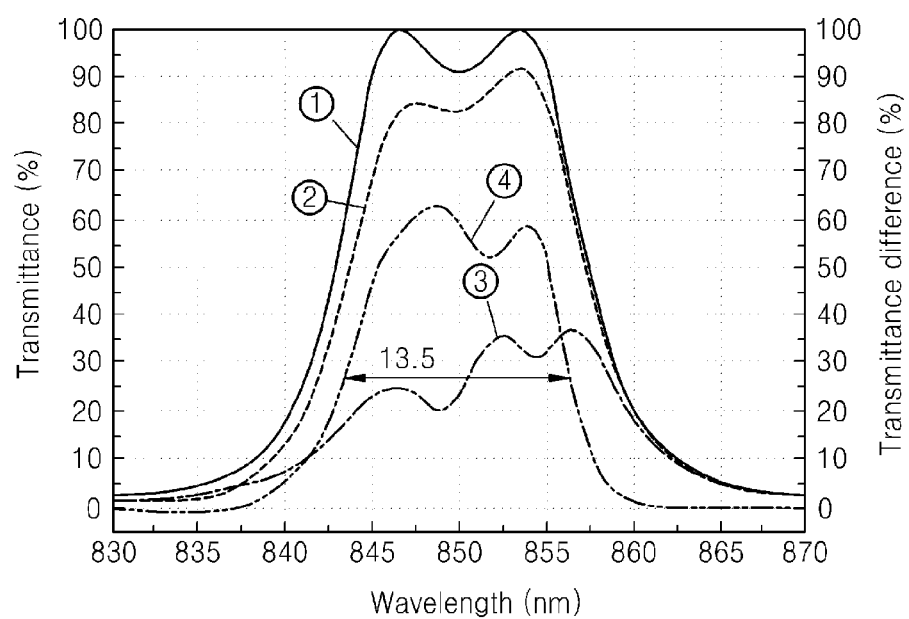
FIG. 14 is a graph showing optical properties of the transmissive light modulator shown in FIG. 12.

FIG. 14 is a graph showing optical properties of the transmissive light modulator 100 shown in FIG. 12. In FIG. 14, the graph ① indicates transmissivities according to wavelengths in a case where it is assumed that no light is absorbed by the first and second active layers 120 and 140. Furthermore, the graph ② indicates transmissivities when no voltage is applied to the transmissive light modulator 100, whereas the graph ③ indicates transmissivities when a reverse bias voltage is applied to the transmissive light modulator 100. Finally, the graph ④ indicates differences between transmissivities indicated by graphs ② and ③ (referred to hereinafter as transmissivity difference(s)). Referring to the graph ④, around the resonating wavelength, the maximum transmissivity difference is nearly 65% and bandwidth of transmissivity differences is about 13.5 nm.

The embodiment shown in FIGS. 10, 11, and 13 as described above is related to the transmissive light modulator 100 having an N-I-P-I-N structure including the n-type first DBR layer 110, the undoped first active layer 120, the p-type second DBR layer 130, the undoped second active layer 140, and the n-type third DBR layer 150. However, as shown in FIG. 15, the transmissive light modulator 100 may be formed to have a P-I-N-I-P structure including the p-type first DBR layer 110, the undoped first active layer 120, the n-type second DBR layer 130, the undoped second active layer 140, and the p-type third DBR layer 150. The transmissive light modulator 100 shown in FIG. 15 may have the same configuration as the transmissive light modulator 100 shown in FIGS. 10, 11, and 13 except for the electric polarities of the first DBR layer 110, the second DBR layer 130, and the third DBR layer 150.

FIG. 16 shows another exemplary design of a transmissive light modulator 100. The transmissive light modulator 100 shown in FIG. 16 has an asymmetrical configuration and may further include micro-cavity layers 111 and 151 that are respectively formed in the first DBR layer 110 and the third DBR layer 150. For example, a first micro-cavity layer 111 arranged in the first DBR layer 110 may be interposed between the low refraction layer 110b and the high refraction layer 110a of the first DBR layer 110, whereas a second micro-cavity layer 151 arranged in the third DBR layer 150 may be interposed between the low refraction layer 150b and the high refraction layer 150a of the third DBR layer 150. The micro-cavity layers 111 and 151 function as additional cavities for Fabry-Perot resonance. Therefore, an optical thickness of each of the micro-cavity layers 111 and 151 may be equal to an integer multiple of $\lambda/2$. In the embodiment shown in FIG. 16, each of the micro-cavity layers 111 and 151 is designed to have an optical thickness of about 1220 Å(=$\lambda/2$). The micro-cavity layers 111 and 151 may be formed of the same material as the high refraction layer (e.g., $Al_{0.2}Ga_{0.8}As$) or the low refraction layer (e.g., $Al_{0.87}Ga_{0.13}As$) of the first and second DBR layers 110 and 150. In the embodiment shown in FIG. 16, the micro-cavity layers 111 and 151 are formed of $Al_{0.2}Ga_{0.8}As$. Furthermore, the micro-cavity layers 111 and 151 may be doped with a dopant of the same type as the first and second DBR layers 110 and 150. For example, if the first and second DBR layers 110 and 150 are doped with an n-type dopant, the micro-cavity layers 111 and 151 may also be doped with an n-type dopant. If the first and second DBR layers 110 and 150 are doped with a p-type dopant, the micro-cavity layers 111 and 151 may also be doped with a p-type dopant.

Figure 17:
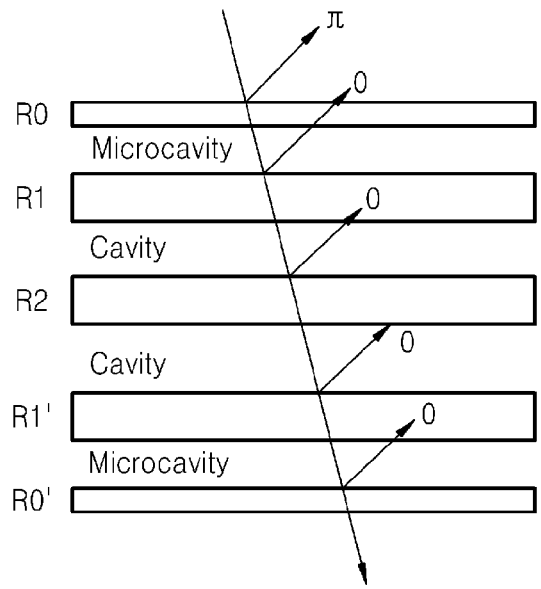
FIG. 17 is a schematic view of a resonance structure of the transmissive light modulator shown in FIG. 16.

The first DBR layer 110 and third DBR layer 150 may be split into lower portions and upper portions by the micro-cavity layers 111 and 151, respectively. Therefore, the transmissive light modulator 100 shown in FIG. 16 includes a total of 5 mirrors including the lower portion and the upper portion of the first DBR layer 110, the second DBR layer 130, and the lower portion and the upper portion of the third DBR layer 150, and includes a total of four cavities including the two micro-cavity layers 111 and 151 and the two active layers 120 and 140. FIG. 17 is a schematic view of a resonance structure of the transmissive light modulator 100 as shown in FIG. 16. In FIG. 17, the reference numeral R0 indicates the reflectivity of the upper portion of the third DBR layer 150 (that is, the portion above the micro-cavity layer 151), the reference numeral R1 indicates the reflectivity of the lower portion of the third DBR layer 150 (that is, the portion below the micro-cavity layer 151), the reference numeral R2 indicates the reflectivity of the second DBR layer 130, the reference numeral R1' indicates the reflectivity of the upper portion of the first DBR layer 110, and the reference numeral R0' indicates the reflectivity of the lower portion of the first DBR layer 110. In an asymmetrical structure, R0≠R0' and R1≠R1'. However, the transmissive light modulator 100 may be designed to have a symmetrical structure, in which R0=R0' and R1=R1'.

Meanwhile, in the embodiment shown in FIG. 16, the first active layer 120 may include 30 first quantum well layers 122, each of which has a thickness of 75 Å, 39 second quantum well layers 124, each of which has a thickness of 80 Å, and the cladding layer 121 having a thickness of 62.6 Å. The second active layer 140 may also include 30 third quantum well layers 142, each of which has a thickness of 75 Å, 38 fourth quantum well layers 144, each of which has a thickness of 80 Å, and the cladding layer 141 having a thickness of 62.6 Å. In this case, optical thickness of the first active layer 120 and the second active layer 140 may be about 3.5λ. Furthermore, the lower portion of the first DBR layer 110 includes 9.5 pairs of a high refraction layer and a low refraction layer, whereas the upper portion of the first DBR layer 110 includes 1 pair of a high refraction layer and a low refraction layer. The second DBR layer 130 includes 13.5 pairs of a high refraction layer and a low refraction layer. Furthermore, the lower portion of the third DBR layer 150 may include 13.5 pairs of a high refraction layer and a low refraction layer, whereas the upper portion of the third DBR layer 150 may include 2 pairs of a high refraction layer and a low refraction layer. The driving voltage of the transmissive light modulator 100 having the structure as described above may be about 8.1 V.

Figure 18:
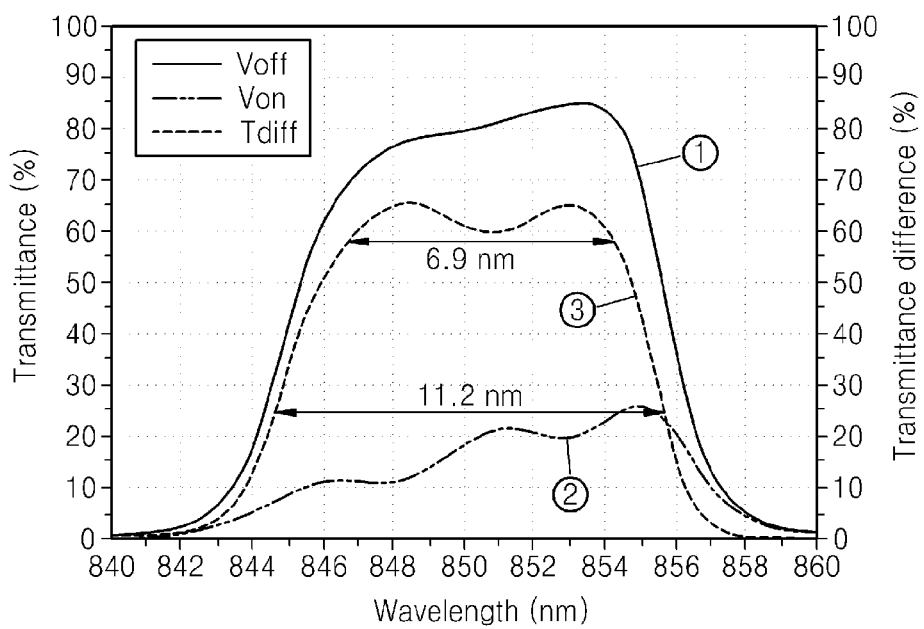
FIG. 18 is a graph showing optical properties of the transmissive light modulator shown in FIG. 16.

FIG. 18 is a graph showing optical properties of the transmissive light modulator 100 shown in FIG. 16. In FIG. 18, the graph ① indicates transmissivities when no voltage is applied to the transmissive light modulator 100. Furthermore, the graph ② indicates transmissivities when a reverse bias voltage is applied to the transmissive light modulator 100, whereas the graph ③ indicates differences between transmissivities indicated by graphs ① and ②. Referring to the graph ③, around the resonating wavelength, the maximum transmissivity difference is nearly 65% and the bandwidth of transmissivity differences is about 11.2 nm. Particularly, in the embodiment shown in FIG. 16, as resonating wavelengths overlap due to the additional micro-cavity layers 111 and 151, highly flat-top transmissivity may be acquired around the maximum value of the graph ③.

As described above, the transmissive light modulator 100 having an N-I-P-I-N structure or a P-I-N-I-P structure may improve transmissivity across a wide wavelength range in a resonating wavelength mode having two or more peaks due to the first active layer 120 and the second active layer 140 having quantum well layers with different thicknesses. Therefore, the transmissive light modulator 100 features wide transmission bandwidth and flat-top transmissivity, and thus the transmissive light modulator 100 may provide stable performance even if a resonating wavelength is changed due to errors in manufacturing processes or external conditions, such as a temperature.

Since the transmissive light modulator 100 according to the present embodiment is a transmissive type, light loss may be minimized by removing the GaAs substrate 101 which absorbs light of wavelengths around 850 nm. The substrate 101 may be removed either by completely removing the substrate 101 via wet-etching or by detaching the substrate 101 via epitaxial lift-off (ELO). However, in this case, other thin-film layers of the transmissive light modulator 100 may be damaged. Therefore, to reduce damages due to a complicated process for removing the substrate 101, the transparent window 101a may be formed at the center of the substrate 101, such that light of wavelengths around 850 nm may be transmitted therethrough. However, if the GaAs substrate 101 is etched to form the transparent window 101a, the first contract layer 102 formed on n-GaAs on the substrate 101 may be damaged. Generally, to reduce light loss due to GaAs, the first contact layer 102 is formed to have a small thickness around 50 nm, and thus, the first contact layer 102 may likely be damaged. If the first contact layer 102 is formed of n-AlGaAs instead of n-GaAs to prevent the first contact layer 102 from being damaged due to etching, it is difficult to form electrodes thereon.

FIGS. 19A through 19H are schematic sectional views showing an exemplary method of forming the transparent window 101a in the substrate 101.

Figure 19A:
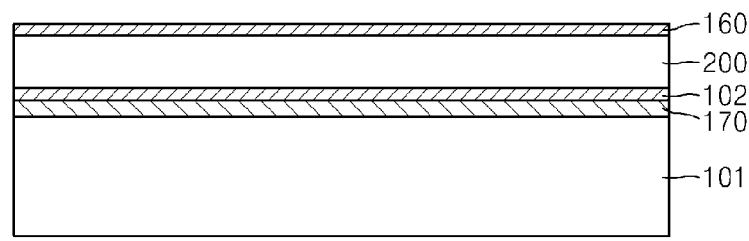
FIGS. 19A through 19H are schematic sectional views showing a method of forming a transparent window in a substrate according to an exemplary embodiment.

First, referring to FIG. 19A, a buffer layer 170 is formed on the GaAs substrate 101. The buffer layer 170 may be formed of AlAs, for example. Next, the first contact layer 102, an epitaxial layer 200, and the second contact layer 160 are sequentially grown on the buffer layer 170. For example, both the first contact layer 102 and the second contact layer 160 may be formed of n-GaAs or p-GaAs. Here, the epitaxial layer 200 may be a layer structure including the first DBR layer 110, the first active layer 120, the second DBR layer 130, the second active layer 140, and the third DBR layer 150.

Figure 19B:
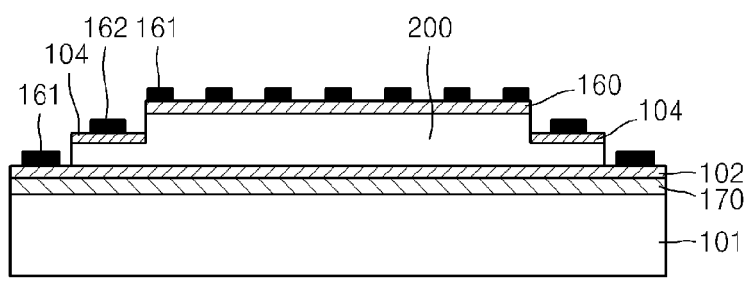

Next, referring to FIG. 19B, a thickness of the substrate 101 may be reduced via chemical mechanical polishing (CMP), for example. For example, a thickness of the substrate 101 may be reduced from 350 um to 200 um. Next, the epitaxial layer 200 and the second contact layer 160 are mesa-etched to partially expose the first contact layer 102. Next, the second active layer 140, the third DBR layer 150, and the second contact layer 160 of the epitaxial layer 200 are mesa-etched to expose the second DBR layer 130 of the epitaxial layer 200. As described above, if the third contact layer 104 is disposed in the second DBR layer 130, etching may be performed until the third contact layer 104 is exposed. Next, the first electrodes 161 may be formed on the first contact layer 102 and the second contact layer 160, and the second electrode 162 may be formed on the third contact layer 104. Although FIG. 19B shows that the electrode connecting structure as shown in FIG. 4 is formed, the electrode connecting structure as shown in FIG. 2 may be formed instead.

Figure 19C:
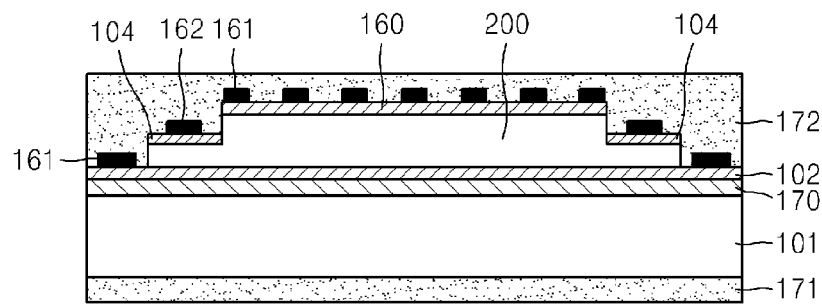

Next, referring to FIG. 19C, to protect the first contact layer 102, the epitaxial layer 200, the second contact layer 160, the first electrode 161, the second electrode 162, and the third contact layer 104 during later dry and wet etching processes, protective layers 171 and 172 may be formed. The protective layers 171 and 172 may completely cover the rear surface of the substrate 101, the lateral surfaces and the top surface of the epitaxial layer 200, and the second contact layer 160 and the second electrode 162. The protective layers 171 and 172 may be formed of $SiO_2$, for example.

Figure 19D:
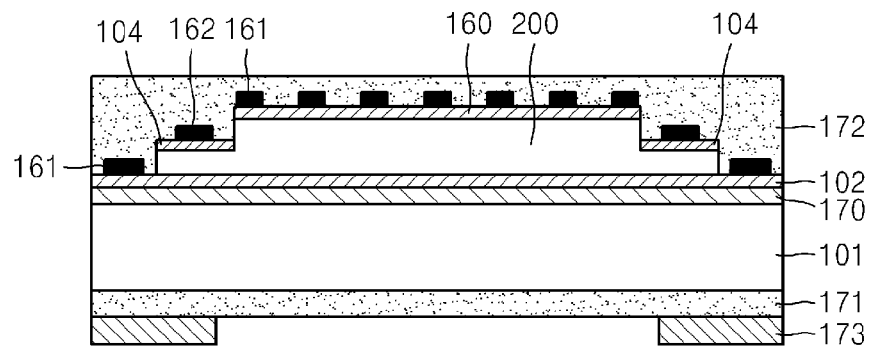
Figure 19E:
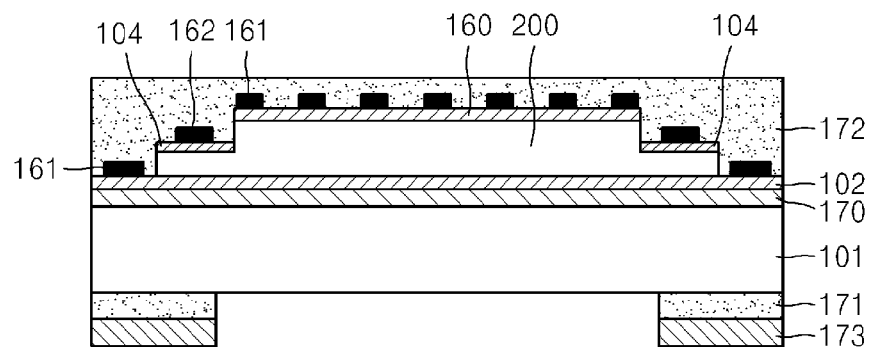

Next, as shown in FIG. 19D, a photoresist 173 is formed on the lower protective layer 171 and patterned. As a result, the photoresist 173 is formed along edge portions of the lower protective layer 171, whereas the center portion of the lower protective layer 171 is exposed to outside. Next, as shown in FIG. 19E, the exposed center portion of the lower protective layer 171 is removed via etching. As a result, the center portion of the substrate 101 may be exposed to the outside.

Figure 19F:
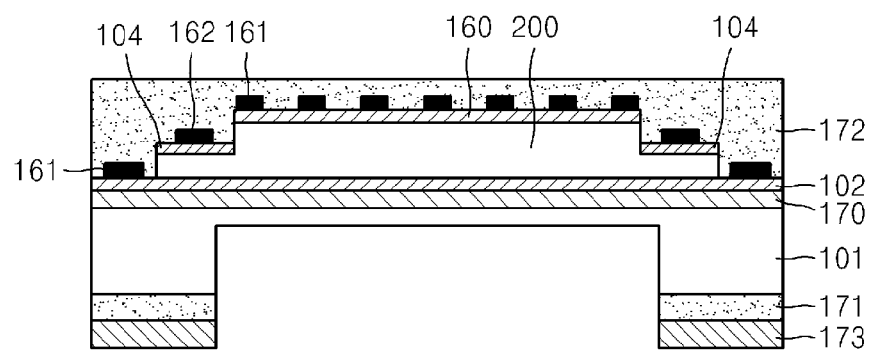
Figure 19G:
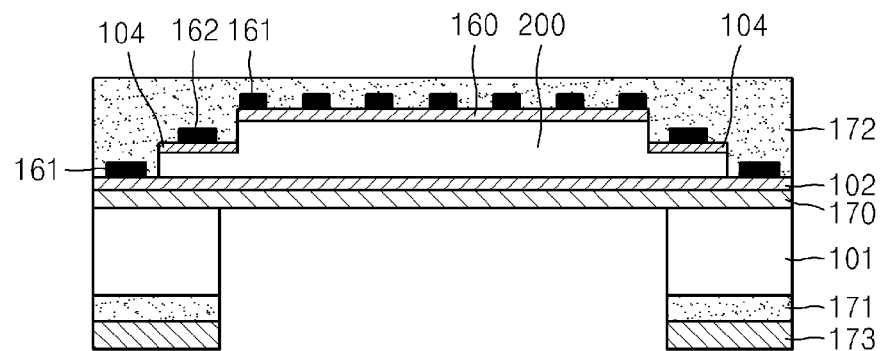

Next, as shown in FIG. 19F, the exposed center portion of the substrate 101 may be removed via dry etching, such as inductive coupled plasma (ICP) etching, for example. The substrate 101 may not be completely removed to expose the buffer layer 170 during the dry etching. Next, as shown in FIG. 19G, the remaining part of the substrate 101 is precisely etched via wet etching. For example, hydroxide solution ($NH_4OH$) may be used as an etchant. When the substrate 101 is completely removed and the buffer layer 170 is exposed, the wet etching is stopped.

Figure 19H:
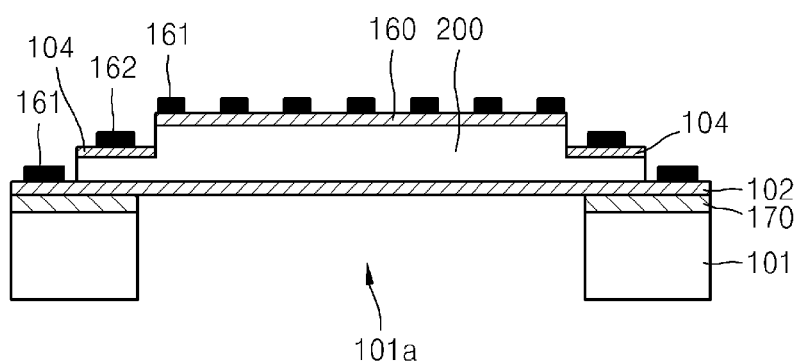

Finally, referring to FIG. 19H, the upper and lower protective layers 171 and 172 may be completely removed by using a proper buffer oxide etchant (BOE). Here, the portion of the buffer layer 170 exposed via the center of the substrate 101 may also be removed. Using the method as described above, the transparent window 101a may be formed in the substrate 101 without damaging various thin-film layers in the epitaxial layer 200.

The method shown in FIGS. 19A through 19H is related to a case in which the first contact layer 102 is formed of GaAs. If the first contact layer 102 is formed of another material, the transparent window 101a may be formed in the substrate 101 using another method. For example, the first contact layer 102 may be formed of InGaP. InGaP may transmit light of wavelengths around 850 nm, and it is easy to form electrodes thereon. Furthermore, InGaP may function as an etch-stop layer against hydroxide used as the etchant, and thus it may be easier to perform an etching process for forming the transparent window 101a.

Figure 20A:
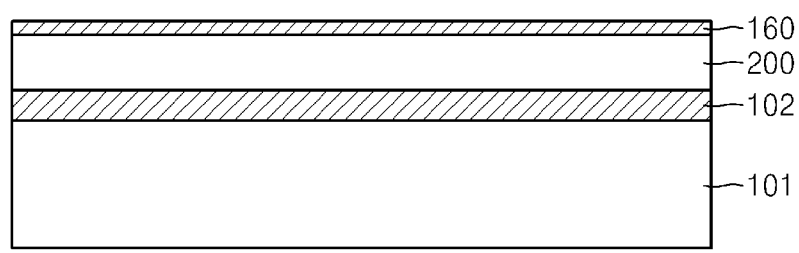
FIGS. 20A through 20C are schematic sectional views showing another method of forming a transparent window in a substrate according to an exemplary embodiment.
Figure 20B:
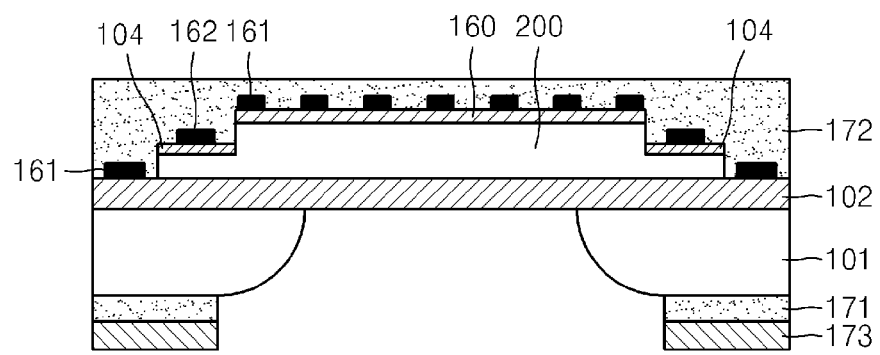
Figure 20C:
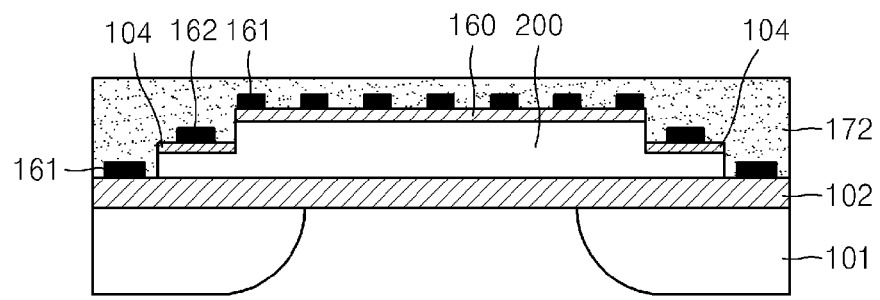

FIGS. 20A through 20C are schematic sectional views showing another exemplary method of forming the transparent window 101a in the substrate 101 in a case where the first contact layer 102 is formed of InGaP.

First, referring to FIG. 20A, the first contact layer 102, an epitaxial layer 200, and the second contact layer 160 are sequentially grown on the GaAs substrate 101. For example, the first contact layer 102 may be formed of n-InGaP or p-InGaP. The second contact layer 160 may be doped with the same type dopant as the first contact layer 102 and may be formed of InGaP or GaAs. Furthermore, the epitaxial layer 200 may be a layer structure including the first DBR layer 110, the first active layer 120, the second DBR layer 130, the second active layer 140, and the third DBR layer 150. If the first contact layer 102 is formed of InGaP, light loss is relatively small compared to a case in which the first contact layer 102 is formed of GaAs, and thus, the first contact layer 102 may be formed to have a sufficient thickness. Therefore, it is not necessary to perform later processes for etching the substrate 101 with high precision.

Next, the same processes as shown in FIGS. 19B through 19E are performed. In other words, after the substrate 101 is polished, the first contact layer 102 and the third contact layer 104 may be exposed by etching the epitaxial layer 200, the first electrodes 161 may be formed on the first contact layer 102 and the second contact layer 160, and the second electrode 162 may be formed on the third contact layer 104. Furthermore, the protective layers 171 and 172 may be formed to cover the rear surface of the substrate 101 and the epitaxial layer 200. Next, the photoresist 173 is formed on edge portions of the lower protective layer 171, and the exposed center portion of the lower protective layer 171 may be removed via etching.

Next, as shown in FIG. 20B, the substrate 101 may be removed via wet etching by using an etchant, such as a hydroxide ($NH_4OH$). If the first contact layer 102 is formed of InGaP, it is not necessary to partially remove the substrate 101 via dry etching in advance. When the substrate 101 is completely removed and the first contact layer 102 formed of InGaP is exposed, the etching may be stopped.

Finally, referring to FIG. 20C, the upper and lower protective layers 171 and 172 may be completely removed by using a proper buffer exide etchant (BOE). Using the method as described above, it is easier to form the transparent window 101a in the substrate 101 without damaging various thin-film layers in the epitaxial layer 200.

Figure 21:
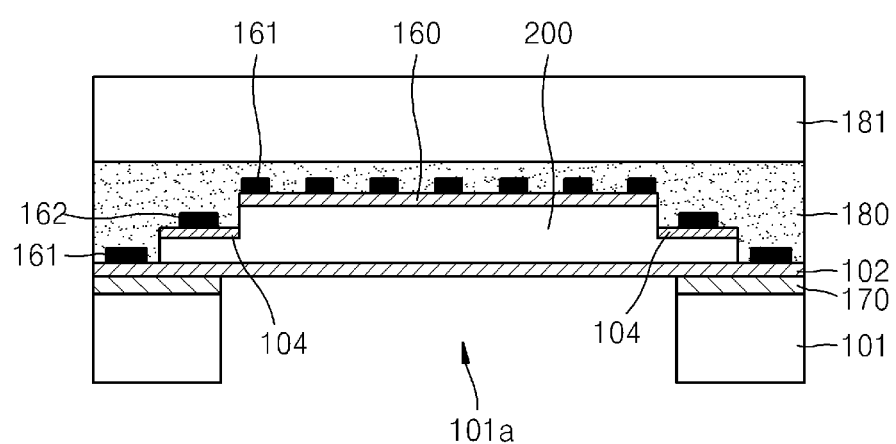
FIG. 21 is a schematic sectional view of an example in which a transparent reinforcement structure is attached onto the top surface of a transmissive light modulator.

Meanwhile, since the transparent window 101a is formed in the substrate 101, the transmissive light modulator 100 may be vulnerable to external shocks. Therefore, as shown in FIG. 21, a transparent reinforcement structure may be attached onto the top surface of the transmissive light modulator 100. Referring to FIG. 21, a transparent epoxy resin 180, for example, may be applied onto the top surface of the transmissive light modulator 100, and a transparent cover 181 may be adhered thereon. The transparent cover 181 may be formed of glass or a transparent plastic material. An anti-reflection layer may be further coated on the light incident surface of the transparent cover 181 to reduce light loss.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A transmissive light modulator comprising:
a first reflection layer;
a first active layer, arranged on the first reflection layer and comprising a plurality of quantum well layers and a plurality of barrier layers;
a second reflection layer arranged on the first active layer;
a second active layer, arranged on the second reflection layer and comprising a plurality of quantum well layers and a plurality of barrier layers; and
a third reflection layer arranged on the second active layer,
wherein the first reflection layer and the third reflection layer are each doped with a first type dopant, and
the second reflection layer is doped with a second type dopant, which is electrically opposite to the first type dopant, such that the first active layer and the second active layer are electrically connected to each other in parallel.

2. The transmissive light modulator of claim 1, wherein each of the first active layer and the second active layer comprises at least a first type quantum well layer and a second type quantum well layer having a thickness different from a thickness of the first quantum well layer.

3. The transmissive light modulator of claim 2, wherein the first active layer comprises a plurality of first type quantum well layers and a plurality of second type quantum well layers.

4. The transmissive light modulator of claim 3, wherein the thickness of the first type quantum well layer is greater than the thickness of the second type quantum well layer, and
a number of the first type quantum well layers is greater than a number of the second type quantum well layers.

5. The transmissive light modulator of claim 3, wherein the plurality of first type quantum well layers and the plurality of second type quantum well layers are alternately arranged, and
each of the plurality of barrier layers is arranged between pairs of the first type quantum well layer and the second type quantum well layer.

6. The transmissive light modulator of claim 3, wherein the first active layer includes a first multiple quantum well (MQW) structure in which the first type quantum well layers and the barrier layers are alternately arranged and a second MQW structure in which the second type quantum well layers and the barrier layers are alternately arranged, and
in the first active layer, the first MQW structure is arranged on the second MQW structure or the second MQW structure is arranged on the first MQW structure.

7. The transmissive light modulator of claim 3, wherein the first active layer further comprises a cladding layer interposed between the first reflection layer and the first active layer and a cladding layer interposed between the second reflection layer and the first active layer.

8. The transmissive light modulator of claim 2, wherein the second active layer comprises a plurality of first type quantum well layers and a plurality of second type quantum well layers, and
a thickness of the first type quantum well layers is different from a thickness of the second type quantum well layers.

9. The transmissive light modulator of claim 8, wherein the thickness of the first type quantum well layer is greater than the thickness of the second type quantum well layer, and
a number of the first type quantum well layers is greater than a number of the second type quantum well layers.

10. The transmissive light modulator of claim 8, wherein the plurality of first type quantum well layers and the plurality of second type quantum well layers are alternately arranged, and
each of the plurality of barrier layers is arranged between pairs of the first type quantum well layer and the second type quantum well layer.

11. The transmissive light modulator of claim 8, wherein the second active layer includes a first multiple quantum well (MQW) structure in which the third first type well layers and the barrier layers are alternately arranged and a second type MQW structure in which the second quantum well layers and the barrier layers are alternately arranged, and
in the second active layer, the first MQW structure is arranged on the second MQW structure or the second MQW structure is arranged on the first MQW structure.

12. The transmissive light modulator of claim 8, wherein the second active layer further comprises a cladding layer interposed between the second reflection layer and the second active layer and a cladding layer interposed between the third reflection layer and the third active layer.

13. The transmissive light modulator of claim 1, wherein a thickness of each of the plurality of quantum well layers of the first active layer is different than a thickness of each of the plurality of quantum well layers of the second active layer.

14. The transmissive light modulator of claim 1, wherein each of the first reflection layer, the second reflection layer, and the third reflection layer layers is a distributed Bragg reflector layer formed by alternately and repeatedly stacking a first type refraction layer and a second type refraction layer, wherein an optical thickness of each of the first type refraction layer and the second type refraction layer is $\lambda/4$, where $\lambda$ is a resonating wavelength of the transmissive light modulator, and wherein a refractive index of the first type refraction layer is different from a refractive index of the second type refraction layer.

15. The transmissive light modulator of claim 14, wherein the first reflection layer and the third reflection layer have the same reflectivity.

16. The transmissive light modulator of claim 14, further comprising:
at least one first micro-cavity layer arranged in the first reflection layer; and
at least one second micro-cavity layer arranged in the third reflection layer,
wherein the first active layer, the second active layer, and at least one of the first micro-cavity layer and the second micro-cavity layer have optical thicknesses that are integer multiples of $\lambda/2$.

17. The transmissive light modulator of claim 16, wherein the first micro cavity layer is interposed between a first type refraction layer and a second type refraction layer of the first reflection layer, and
the second micro cavity layer is interposed between a first type refraction layer and a second type refraction layer of the third reflection layer.

18. The transmissive light modulator of claim 17, wherein the first micro cavity layer and the second micro cavity layer are each formed of the same material as one of the first type refraction layer and the second type refraction layer.

19. The transmissive light modulator of claim 1, further comprising:
a first contact layer, which is arranged on a rear surface of the first reflection layer;
a second contact layer, which is arranged on a top surface of the third reflection layer; and
a third contact layer, which is arranged in the second reflection layer,
wherein the third contact layer is arranged in a portion of the second reflection layer that is exposed by a partially-removed portion of the second contact layer, the third reflection layer, and the second active layer.

20. The transmissive light modulator of claim 19, wherein the first contact layer, the second contact layer, and the third contact layer are each formed of one of GaAs and InGaP,
the first contact layer and the second contact layer are each doped with a first type dopant, and
the third contact layer is doped with a second type dopant.

21. The transmissive light modulator of claim 19, further comprising:
a plurality of first electrodes arranged on each of the first contact layer and the second contact layer; and
a second electrode arranged on the third contact layer.

22. The transmissive light modulator of claim 21, further comprising an insulation layer formed around the first reflection layer, the first active layer, the second reflection layer, the second active layer, the third reflection layer, and the second contact layer,
wherein the plurality of first electrodes each extend from the first contact layer onto the second contact layer around lateral surfaces of the insulation layer.

23. The transmissive light modulator of claim 21, further comprising a metal pattern, which is arranged on the second contact layer and is electrically connected to the plurality of first electrodes.

24. The transmissive light modulator of claim 19, further comprising:
a substrate arranged on a rear surface of the first contact layer; and
a transparent window, which penetrates a center portion of the substrate.

25. The transmissive light modulator of claim 24, further comprising:
a transparent resin disposed on the second contact layer; and
a transparent cover arranged on the transparent resin.

* * * * *